(12) United States Patent
Wang et al.

(10) Patent No.: US 12,170,040 B2
(45) Date of Patent: Dec. 17, 2024

(54) FLEXIBLE DISPLAY DEVICE WITH A SLIDABLE REGION AND CONTROL METHOD THEREOF

(71) Applicant: BOE Technology Group Co., Ltd., Beijing (CN)

(72) Inventors: Bo Wang, Beijing (CN); Fuqiang Li, Beijing (CN)

(73) Assignee: Beijing BOE Technology Development Co., Ltd., Beijing (CN)

( * ) Notice: Subject to any disclaimer, the term of this patent is extended or adjusted under 35 U.S.C. 154(b) by 0 days.

(21) Appl. No.: 17/915,427

(22) PCT Filed: Nov. 26, 2021

(86) PCT No.: PCT/CN2021/133687
§ 371 (c)(1),
(2) Date: Sep. 28, 2022

(87) PCT Pub. No.: WO2023/092496
PCT Pub. Date: Jun. 1, 2023

(65) Prior Publication Data
US 2024/0212543 A1    Jun. 27, 2024

(51) Int. Cl.
*G09G 3/00* (2006.01)
*H01L 27/144* (2006.01)

(52) U.S. Cl.
CPC ......... *G09G 3/035* (2020.08); *H01L 27/1443* (2013.01); *H01L 27/1446* (2013.01); *G09G 2300/0426* (2013.01); *G09G 2340/0442* (2013.01); *G09G 2354/00* (2013.01); *G09G 2360/144* (2013.01)

(58) Field of Classification Search
CPC .......... G09G 3/035; G09G 2300/0426; G09G 2340/0442; G09G 2354/00; G09G 2360/144; G06F 1/1652; G06F 2203/04102; G09F 9/301; H01L 27/1443; H01L 27/1446
See application file for complete search history.

(56) References Cited

U.S. PATENT DOCUMENTS

| | | |
|---|---|---|
| 2013/0334981 A1 | 12/2013 | Kwack et al. |
| 2014/0002430 A1 | 1/2014 | Kwack et al. |
| 2014/0204037 A1 | 7/2014 | Kim |
| 2016/0358552 A1 | 12/2016 | Wang et al. |
| 2018/0032106 A1* | 2/2018 | Yu .......... G06F 1/1652 |
| 2018/0107306 A1* | 4/2018 | Hong .......... G06F 1/1626 |
| 2018/0217679 A1* | 8/2018 | Kwon .......... G06V 40/10 |

(Continued)

FOREIGN PATENT DOCUMENTS

| | | |
|---|---|---|
| CN | 103513816 A | 1/2014 |
| CN | 103514814 A | 1/2014 |

(Continued)

*Primary Examiner* — Temesghen Ghebretinsae
*Assistant Examiner* — Ivelisse Martinez Quiles
(74) *Attorney, Agent, or Firm* — IPro, PLLC

(57) ABSTRACT

Provided is a display device, which includes a flexible display panel including a display region and a peripheral region surrounding the display region; a driver integrated circuit (IC) disposed in the peripheral region; a plurality of detection circuits disposed in the peripheral region and close to the slidable region; at least one input signal line; at least one control signal line and at least one detection signal line.

20 Claims, 11 Drawing Sheets

(56) References Cited

U.S. PATENT DOCUMENTS

| | | | |
|---|---|---|---|
| 2019/0286194 A1* | 9/2019 | Xia | G06F 1/1616 |
| 2021/0004193 A1 | 1/2021 | Yamazaki et al. | |
| 2021/0026413 A1 | 1/2021 | Kwak et al. | |
| 2022/0137777 A1* | 5/2022 | Wu | G06F 3/04186 |
| | | | 345/174 |
| 2022/0148474 A1* | 5/2022 | Kwon | G01J 1/4204 |
| 2022/0148477 A1* | 5/2022 | Han | G09G 5/391 |
| 2023/0141559 A1* | 5/2023 | Kim | H04M 1/0268 |
| | | | 361/679.56 |
| 2023/0213977 A1* | 7/2023 | Kim | G06F 1/3262 |
| | | | 345/173 |

FOREIGN PATENT DOCUMENTS

| | | |
|---|---|---|
| CN | 104021749 A | 9/2014 |
| CN | 104505005 A | 4/2015 |
| CN | 104662489 A | 5/2015 |
| CN | 105164609 A | 12/2015 |
| CN | 107111997 A | 8/2017 |
| CN | 107248376 A | 10/2017 |
| CN | 107665657 A | 2/2018 |
| CN | 107820629 A | 3/2018 |
| CN | 109712532 A | 5/2019 |
| CN | 110322793 A | 10/2019 |
| CN | 111106152 A | 5/2020 |
| CN | 111145649 A | 5/2020 |
| CN | 111463246 A | 7/2020 |
| CN | 112289188 A | 1/2021 |
| CN | 112509470 A | 3/2021 |
| CN | 112908181 A | 6/2021 |
| CN | 112927619 A | 6/2021 |
| EP | 2987051 B1 | 9/2018 |
| WO | 2017090826 A1 | 6/2017 |

\* cited by examiner

FLEXIBLE DISPLAY DEVICE WITH A SLIDABLE REGION AND CONTROL METHOD THEREOF

CROSS-REFERENCE TO RELATED APPLICATION

This application is a U.S. national stage of international application No. PCT/CN2021/133687, filed on Nov. 26, 2021, the disclosure of which is herein incorporated by reference in its entirety.

TECHNICAL FIELD

The present disclosure relates to the field of display technologies, and in particular, relates to a display device and a control method thereof.

BACKGROUND

With the development of display technologies, flexible slidable and rollable display devices become a new development direction in the display technologies.

SUMMARY

The present disclosure provides a display device and a control method thereof. The technical solutions are as follows.

According to some embodiments of the present disclosure, a display device is provided. The display device includes:
- a flexible display panel including a display region and a peripheral region surrounding the display region, wherein the display region includes a slidable region and a fixed region;
- a driver integrated circuit (IC) disposed in the peripheral region;
- a plurality of detection circuits disposed in the peripheral region and close to the slidable region;
- at least one input signal line, wherein one end of the at least one input signal line is electrically connected to the driver IC and the other end of the at least one input signal line is electrically connected to the plurality of detection circuits;
- at least one control signal line, wherein one end of the at least one control signal line is electrically connected to the driver IC and the other end of the at least one control signal line is electrically connected to the plurality of detection circuits; and
- at least one detection signal line, wherein one end of the at least one detection signal line is electrically connected to the driver IC and the other end of the at least one detection signal line is electrically connected to the plurality of detection circuits;
- wherein each of the detection circuits is turned off under control of a control signal provided by the control signal line, and is configured to transmit a detection current to the detection signal line based on an input signal provided by the input signal line when detecting external ambient light; the driver IC stores a corresponding relationship between a current range and a length of an effective display region in a first direction, wherein the effective display region includes the fixed region and an expanded region of the slidable region, and the first direction is an arrangement direction of the slidable region and the fixed region; the driver IC is configured to determine the length of the effective display region of the flexible display panel in the first direction based on a magnitude of the detection current in the detection signal line and the corresponding relationship and control the effective display region to display an image based on the length of the effective display region in the first direction.

In some embodiments, the detection circuits each include at least one phototransistor; wherein
a gate of the phototransistor is electrically connected to the control signal line, a first electrode of the phototransistor is electrically connected to the input signal line, and a second electrode of the phototransistor is electrically connected to the detection signal line.

In some embodiments, the plurality of detection circuits are arranged in the first direction; and each of the detection circuits includes a plurality of phototransistors, wherein the plurality of the phototransistors are arranged in a second direction, and the second direction intersects the first direction.

In some embodiments, wherein the at least one input signal line each includes at least one first input line segment and a plurality of second input line segments, each of the second input line segments being connected to the at least one first input line segment; wherein
each of the at least one first input line segment is extended in the first direction, each of the second input line segments is extended in the second direction, and the first electrode of each of the phototransistors is electrically connected to one of the second input line segments.

In some embodiments, the at least one input signal line each includes two first input line segments; wherein
one end of each of the second input line segments is connected to one of the first input line segments and the other end of each of the second input line segments is connected to the other one of the first input line segments.

In some embodiments, the at least one control signal line each includes at least one first control line segment and a plurality of second control line segments, each of the second control line segments being connected to the at least one first control line segment; wherein
each of the at least one first control line segment is extended in the first direction, each of the second control line segments is extended in the second direction, and the gate of each of the phototransistors is electrically connected to one of the second control line segments.

In some embodiments, the at least one control signal line each includes two first control line segments; wherein
one end of each of the second control line segments is connected to one of the first control line segments and the other end of each of the second control line segments is connected to the other one of the first control line segments.

In some embodiments, the at least one detection signal line each includes at least one first detection line segment and a plurality of second detection line segments, each of the second detection line segments being connected to the at least one first detection line segment; wherein
each of the at least one first detection line segment is extended in the first direction, each of the second detection line segments is extended in the second direction, and the gate of each of the phototransistors is electrically connected to one of the second detection line segments.

In some embodiments, the at least one detection signal line each includes two first detection line segments; wherein
one end of each of the second detection line segments is connected to one of the first detection line segments and the other end of each of the second detection line segments is connected to the other one of the first detection line segments.

In some embodiments, the flexible display panel includes a first substrate, and a first active layer, a first insulation layer, and a first gate layer that are sequentially stacked in a direction away from the first substrate; wherein
the first active layer includes an active pattern of the at least one phototransistor, the active pattern includes a channel region, the first electrode, and the second electrode, and an orthographic projection of the gate of the phototransistor on the substrate is within the channel region.

In some embodiments, the flexible display panel further includes a second insulation layer, a first metal layer, a third insulation layer, and a second metal layer that are sequentially stacked in a direction away from the first gate layer;
wherein the at least one detection signal line is disposed in the first gate layer and is electrically connected to the second electrode through at least one first via hole in the first insulation layer;
the at least one input signal line is disposed in the first metal layer and is electrically connected to the first electrode through at least one second via hole in the first insulation layer and the second insulation layer; and
the at least one control signal line is disposed in the second metal layer and is electrically connected to the gate of the phototransistor through at least one third via hole in the first insulation layer, the second insulation layer, and the third insulation layer.

In some embodiments, the display device further includes a gate driver on array (GOA) circuit integrated in the flexible display panel; wherein
the GOA circuit is closer to the slidable region than the plurality of detection circuits are, or the GOA circuit is farther away from the slidable region than the plurality of detection circuits are.

In some embodiments, the display device further includes a touch panel disposed on a display side of the flexible display panel; wherein the touch panel includes a substrate, and an active layer, a first insulation layer, and a gate layer that are sequentially stacked in a direction away from the second substrate; wherein
the second active layer includes an active pattern of the at least one phototransistor, the active pattern includes a channel region, the first electrode, and the second electrode, and an orthographic projection of the gate of the phototransistor on the second substrate is within the channel region.

In some embodiments, the flexible display panel further includes a fifth insulation layer, a third metal layer, a sixth insulation layer, and a fourth metal layer that are sequentially stacked in a direction away from the second gate layer;
wherein the at least one detection signal line is disposed in the second gate layer and is electrically connected to the second electrode through at least one first via hole in the fourth insulation layer;
the at least one input signal line is disposed in the third metal layer and is electrically connected to the first electrode through at least one second via hole in the fourth insulation layer and the fifth insulation layer; and
the at least one control signal line is disposed in the fourth metal layer and is electrically connected to the gate of the phototransistor through at least one third via hole in the fourth insulation layer, the fifth insulation layer, and the sixth insulation layer.

In some embodiments, the display device further includes a GOA circuit integrated in the flexible display panel; wherein
orthographic projections of the plurality of detection circuits on the flexible display panel are within a region in which the GOA circuit is disposed.

In some embodiments, the plurality of detection circuits include a plurality of first detection circuits and a plurality of second detection circuits; the at least one input signal line includes a first input signal line and a second input signal line; the at least one control signal line includes a first control signal line and a second control signal line; and the at least one detection signal line includes a first detection signal line and a second detection signal line;
wherein the plurality of first detection circuits, the first input signal line, the first control signal line, and the first detection signal line are all disposed in the peripheral region and close to a first boundary of the slidable region, and the first detection circuits are electrically connected to the first input signal line, the first control signal line, and the first detection signal line; and
the plurality of second detection circuits, the second input signal line, the second control signal line, and the second detection signal line are all disposed in the peripheral region and close to a second boundary of the slidable region, the second detection circuits are electrically connected to the second input signal line, the second control signal line, and the second detection signal line, and an extension direction of the first boundary and an extension direction of the second boundary are both the first direction.

In some embodiments, the plurality of first detection circuits and the plurality of second detection circuits are symmetrically arranged about an axis of the slidable region, and an extension direction of the axis is parallel to the first direction; and
the first input signal line and the second input signal line are symmetrically arranged about the axis; the first control signal line and the second control signal line are symmetrically arranged about the axis; and the first detection signal line and the second detection signal line are symmetrically arranged about the axis.

In some embodiments, the display device further includes an input signal connection line, a control signal connection line, and a detection signal connection line; wherein
the first input signal line and the second input signal line are connected through the input signal connection line, the first control signal line and the second control signal line are connected through the control signal connection line, and the first detection signal line and the second detection signal line are connected through the detection signal connection line; and
the input signal connection line, the control signal connection line, and the detection signal connection line are all disposed in the peripheral region that is on a side of the slidable region away from the fixed region.

According to some embodiments of the present disclosure, a method for controlling a display device is provided. The method is applied to driving the display device described in the above aspect. The method includes:
in a process of rolling up or unrolling a slidable region of a flexible display panel, turning on at least one target detection circuit in the plurality of detection circuits when the at least one target detection circuit detects external ambient light, and transmitting, by the at least one target detection circuit, a detection current to a detection signal line based on an input signal provided by an input signal line; wherein the at least one target detection circuit is disposed in a peripheral region of the flexible display panel that is proximate to the slidable region in an effective display region;

determining, by the driver integrated circuit (IC), the length of the effective display region of the flexible display panel in the first direction (X) based on the corresponding relationship between the current range and the length of the effective display region in the first direction (X), and the magnitude of the detection current in the detection signal line; and controlling, by the driver IC, the effective display region to display an image based on the length of the effective display region of the flexible display panel in the first direction.

In some embodiments, the magnitude of the detection current in the detection signal line is positively correlated with a number of target detection circuits in the plurality of detection circuits; and the length of the effective display region in the first direction is positively correlated with the magnitude of the detection current in the detection signal line.

BRIEF DESCRIPTION OF THE DRAWINGS

For clearer descriptions of the technical solutions in the embodiments of the present disclosure, the following briefly describes the accompanying drawings required for describing the embodiments. The accompanying drawings in the following description show merely some embodiments of the present disclosure, and those of ordinary skill in the art may still derive other drawings from these accompanying drawings without creative effort.

DETAILED DESCRIPTION

To make the objective, technical solutions, and advantages of the present disclosure clearer, embodiments of the present disclosure will be further described in detail with reference to the accompanying drawings.

Conventionally, a rollable display device includes a flexible display panel. A display region of the flexible display panel includes a slidable region and a fixed region. The flexible display panel is made of a flexible material. The slidable region of the flexible display panel may be gradually rolled up or unrolled. When the slidable region of the flexible display panel is gradually rolled up, the region of the flexible display panel that displays images gradually becomes smaller. When the slidable region of the flexible display panel is gradually unrolled, the region of the flexible display panel that displays images gradually becomes larger.

However, when the region of the flexible display panel that displays images gradually changes, the area of the region of the flexible display panel that displays images is not determined in real time. Consequently, the images displayed on the flexible display panel are not controlled in real time, and the flexibility is poor.

Terms used in the embodiments of the present disclosure are only used to illustrate the embodiments of the present disclosure, but not intended to limit the present disclosure. Unless otherwise defined, the technical or scientific terms used in the embodiments of the present disclosure have the general meanings as usually understood by those of ordinary skill in the art to which the present disclosure pertains. "First", "second", "third", and similar words used in this specification and in the claims do not denote any order, quantity or importance, but are merely intended to distinguish between different constituents. Similarly, the terms "one", "a/an", and similar words are not meant to be limiting, but rather denote the presence of at least one. "Comprising", "including", and similar words mean that element or article appearing before "comprising" or "including" includes the elements or articles and their equivalent elements appearing behind "comprising" or "consisting", without excluding any other elements or articles. "Connected to", "connected with", and similar expressions are not restricted to physical or mechanical connections, but includes direct and indirect electrical connections. "Upper", "lower", "left", "right", and the like are only used to indicate a relative positional relationship, and when the absolute position of the described object is changed, the relative positional relationship is changed accordingly.

Figure 1:
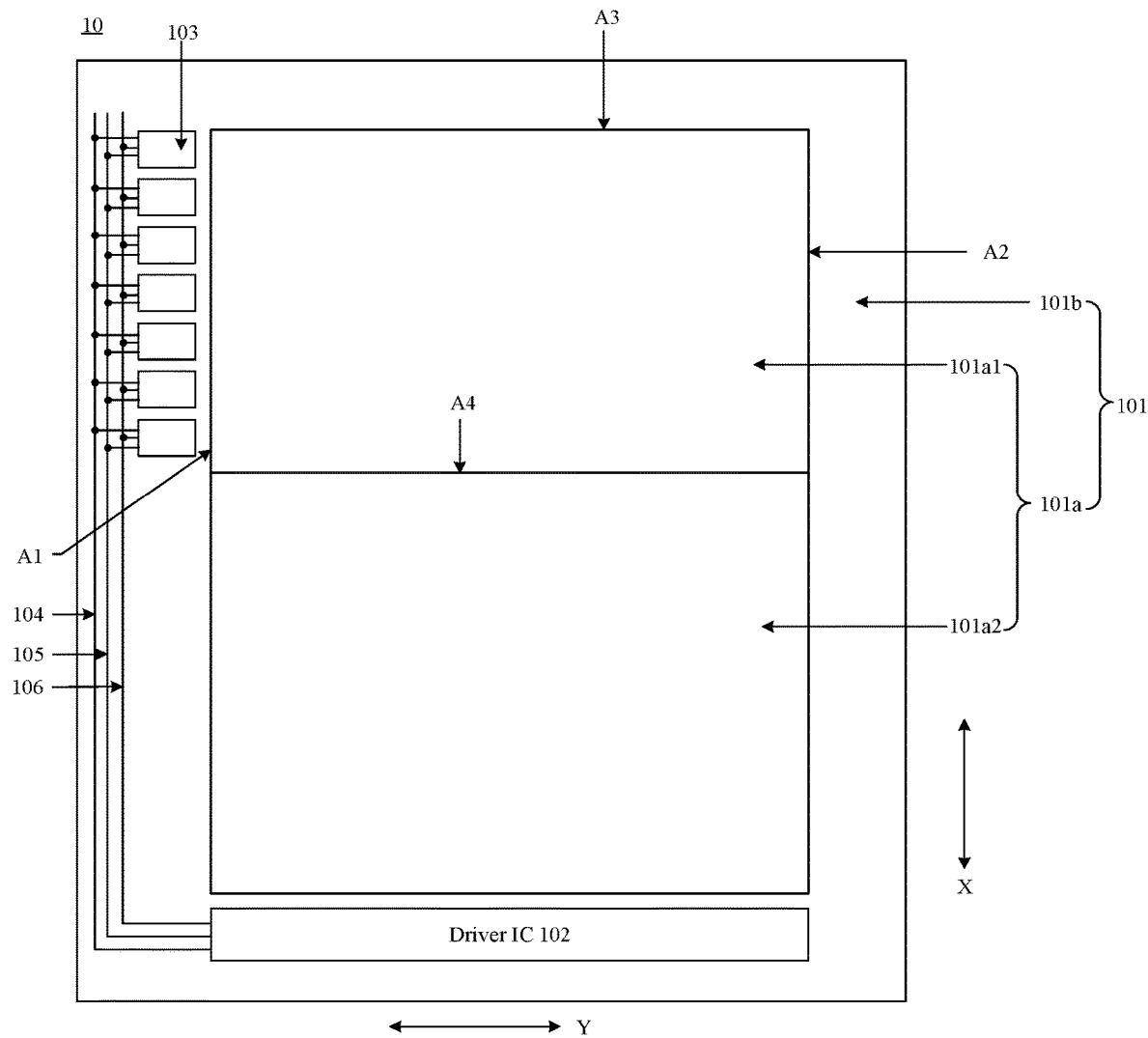
FIG. 1 is a schematic structural diagram of a display device according to some embodiments of the present disclosure.

FIG. 1 is a schematic structural diagram of a display device according to some embodiments of the present disclosure. Referring to FIG. 1, the display device 10 includes a flexible display panel 101, a driver (integrated circuit) IC 102, a plurality of detection circuits 103, at least one input signal line 104, at least one control signal line 105, and at least one detection signal line 106. Here, one input signal line 104, one control signal line 105, and one detection signal line 106 are shown in FIG. 1.

Figure 2:
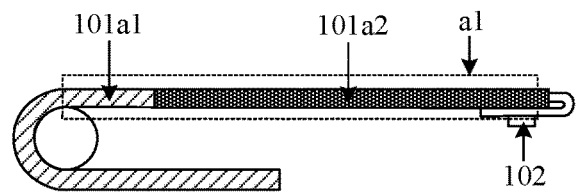
FIG. 2 is a sectional view of a display device with a slidable region at least partially rolled up according to some embodiments of the present disclosure.
Figure 3:
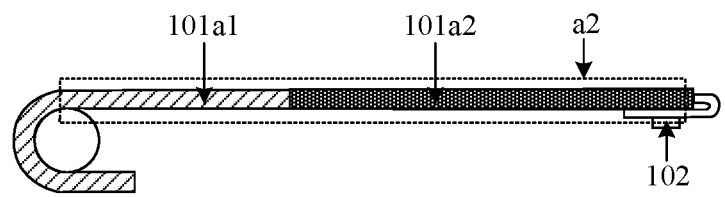
FIG. 3 is a sectional view of a display device with a slidable region at least partially unrolled according to some embodiments of the present disclosure.

Referring to FIG. 1, the flexible display panel 101 includes a display region 101a and a peripheral region 101b surrounding the display region 101a. The display region 101a includes a slidable region 101a1 and a fixed region 101a2. Referring to FIG. 2 and FIG. 3, FIG. 2 is a sectional view a display device when the slidable region 101a1 is at least partially rolled up, and FIG. 3 is a sectional view a display device when the slidable region 101a1 is partially unrolled. Referring to FIG. 2 and FIG. 3, the slidable region 101a1 is a region of the flexible display panel 101 that is rolled up or unrolled in a first direction X, and the fixed region 101a2 is a region of the flexible display panel 101 that is rolled up or unrolled. The first direction X is an arrangement direction of the slidable region 101a1 and the fixed region 101a2.

The driver IC 102 is disposed in the peripheral region 101b. For example, the driver IC 102 is disposed in the peripheral region 101b which is on a side of the fixed region 101a2 away from the slidable region 101a1 in FIG. 1. The plurality of detection circuits 103 is disposed in the peripheral region 101b and close to the slidable region 101a1. For example, the plurality of detection circuits 103 are all disposed on a left side of the slidable region 101a1 in FIG. 1.

In the embodiments of the present disclosure, one end of the at least one input signal line 104 is electrically connected to the driver IC 102 and the other end is electrically connected to the plurality of detection circuits 103. One end of the at least one control signal line 105 is electrically connected to the driver IC 102 and the other end is electrically connected to the plurality of detection circuits 103. One end of the at least one detection signal line 106 is electrically connected to the driver IC 102 and the other end is electrically connected to the plurality of detection circuits 103.

Optionally, referring to FIG. 1, the at least one input signal line 104, the at least one control signal line 105, and the at least one detection signal line 106 are disposed in the peripheral region 101b.

The driver IC 102 provides input signals to the plurality of detection circuits 103 through the at least one input signal line 104. The driver IC 102 provides control signals to the plurality of detection circuits 103 through the at least one control signal line 105. Moreover, the driver IC 102 receives a detection current transmitted by the plurality of detection circuits 103 through the at least one detection signal line 106.

In the embodiments of the present disclosure, each detection circuit 103 is turned off under control of the control signal provided by the control signal line 105 and transmits the detection current to the detection signal line 106 based on the input signal provided by the input signal line 104 when external ambient light is detected. The driver IC 102 stores a corresponding relationship between a current range and a length of an effective display region in the first direction X. The driver IC 102 is configured to determine the length of the effective display region of the flexible display panel 101 in the first direction X based on the magnitude of the detection current in the detection signal line 106 and the corresponding relationship, and control the effective display region to display an image based on the length. For example, the driver IC 102 determines the size and display position of the image to be displayed based on the length, and then display the image in the effective display region based on the determined size and display position of the image. The image displayed on the flexible display panel 101 fills the effective display region, and no image is displayed other regions of the display region 101a of the flexible display panel 101 except the effective display region.

The effective display region includes the fixed region 101a2 and an expanded region of the slidable region 101a1. For example, the region a1 shown in FIG. 2 and the region a2 shown in FIG. 3 are both effective display regions.

In summary, the embodiments of the present disclosure provide a display device. In the process of rolling up or unrolling the slidable region of the flexible display panel of the display device, each detection circuit detects the external ambient light in real time, and transmit the detection current to the detection signal line based on the input signal provided by the input signal line when the external ambient light is detected. Therefore, the driver IC detects, from the detection signal line, the magnitude of the detection current transmitted by the detection circuit, and further determine the length of the effective display region of the flexible display panel in the first direction based on the corresponding relationship between the current range and the length of the effective display region in the first direction. The driver IC controls the effective display region to display the image based on the length of the effective display region in the first direction, and the flexibility is high. In addition, the length of the effective display region in the first direction determined based on the magnitude of the detection current transmitted by the plurality of detection circuits is accurate. Because the detection circuit is turned off under control of the control signal provided by the control signal line, and transmit the detection current to the detection signal line based on the input signal provided by the input signal line only when detecting the external ambient light, the accuracy and reliability of the detection current received by the driver IC is ensured.

Figure 4:
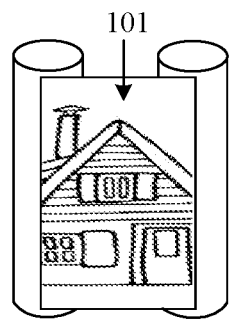
FIG. 4 is a schematic diagram of a display device with two slidable regions rolled up according to some embodiments of the present disclosure.
Figure 5:
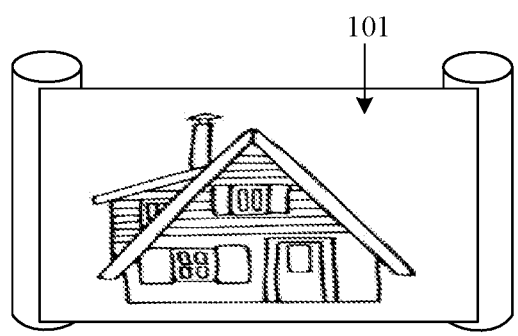
FIG. 5 is a schematic diagram of a display device with two slidable regions unrolled according to some embodiments of the present disclosure.

Referring to FIG. 1 to FIG. 3, the display region 101a of the flexible display panel 101 includes one slidable region 101a1 and one fixed region 101a2. Certainly, referring to FIG. 4 and FIG. 5, the display region 101a is alternatively include two slidable regions 101a1 and one fixed region 101a2. The two slidable regions 101a1 is respectively located on two sides of the fixed region 101a2. FIG. 4 is a schematic diagram of a display device with both slidable regions rolled up, and FIG. 5 is a schematic diagram of a display device both slidable regions unrolled.

In the embodiments of the present disclosure, the magnitude of the detection current in the detection signal line 106 is positively correlated with the number of target detection circuits in the plurality of detection circuits 103. The length of the effective display region in the first direction X is positively correlated with the magnitude of the detection current in the detection signal line 106. The target detection circuits in the plurality of detection circuits 103 detects the external ambient light, while other detection circuits in the plurality of detection circuits 103 except the target detection circuits does not detect the external ambient light.

The detection circuit 103 corresponding to a rolled part of the slidable region 101a1 of the flexible display panel 101 (a region of the slidable region 101a1 which does not belong to the effective display region) does not detect the external ambient light. Therefore, the detection circuit 103 corresponding to the rolled part is turned off under control of the control signal provided by the control signal line 105. The target detection circuit corresponding to the effective display region of the slidable region 101a1 of the flexible display panel 101 is exposed outside, and the target detection circuit detects the external ambient light. Therefore, the target detection circuit transmits the detection current to the detection signal line 106 based on the input signal provided by the input signal line 104.

The greater the length of the effective display region in the slidable region 101a1 of the flexible display panel 101 in the first direction X (that is, the larger the expanded region of the slidable region 101a1 of the flexible display panel 101), the more the exposed target detection circuits. The exposed target detection circuits transmit the detection current to the detection signal line 106 based on the input signal. Further, the detection current in the detection signal line 106 detected by the driver IC 102 is large.

Correspondingly, the smaller the length of the effective display region in the slidable region 101a1 of the flexible display panel 101 in the first direction X (that is, the smaller the expanded region of the slidable region 101a1 of the flexible display panel 101), the fewer the exposed target detection circuits. The exposed target detection circuits transmit the detection current to the detection signal line 106 based on the input signal. Further, the detection current in the detection signal line 106 detected by the driver IC 102 is small.

Figure 6:
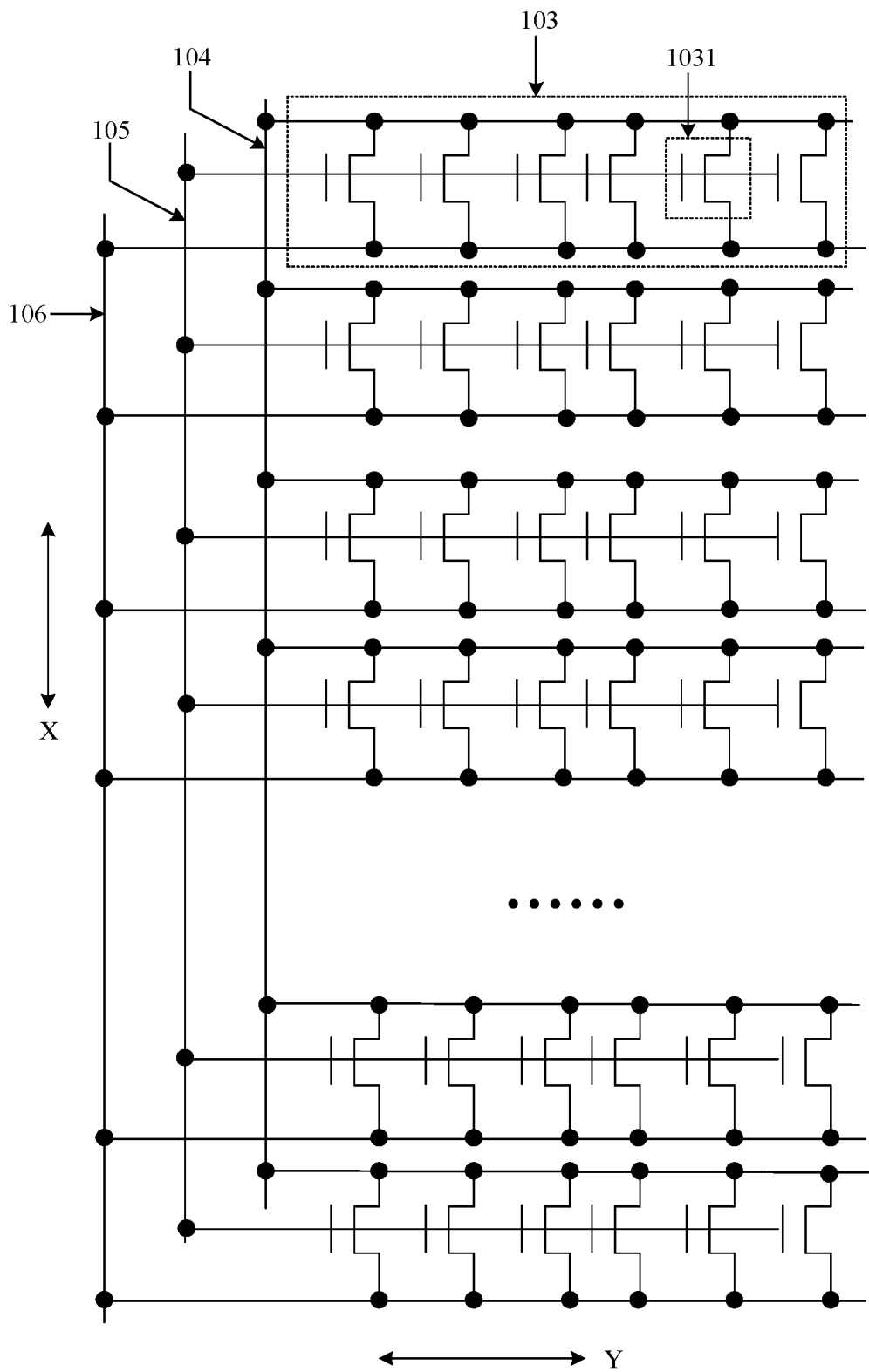
FIG. 6 is a schematic structural diagram of a plurality of detection circuits according to some embodiments of the present disclosure.

FIG. 6 is a schematic structural diagram of a plurality of detection circuits according to some embodiments of the present disclosure. Referring to FIG. 6, each detection circuit 103 includes at least one phototransistor 1031. The gate of the phototransistor 1031 is electrically connected to the control signal line 105, the first electrode of the phototransistor 1031 is electrically connected to the input signal line 104, and the second electrode of the phototransistor 1031 is electrically connected to the detection signal line 106.

Optionally, the plurality of detection circuits 103 are arranged in the first direction X. Each detection circuit 103 includes a plurality of phototransistors 1031 (for example, each detection circuit 103 includes 6 phototransistors 1031 in FIG. 6). The plurality of phototransistors 1031 in each detection circuit 103 are arranged in a second direction Y. The second direction Y intersects the first direction X. For example, the second direction Y is perpendicular to the first direction X.

The more the phototransistors 1031 included in each detection circuit 103, the larger the detection current transmitted by the detection circuit 103 to the driver IC 102 when the detection circuit 103 detects the ambient light. Therefore, the larger the change in the detection current (the change relative to the detection current when the detection circuit 103 does not detect the ambient light) that the driver IC 102 detects, which is more helpful for the driver IC 102 to detect the accurate detection current. Further, the driver IC 102 more accurately determines the length of the effective display region in the first direction X, to improve display flexibility of the display device.

Optionally, the number of the phototransistors 1031 included in each detection circuit 103 is positively correlated with the length, in the second direction Y, of the peripheral region 101b close to a first boundary A1 (or a second boundary A2) of the slidable region 101a1. That is, the larger the length, in the second direction Y, of the peripheral region 101b close to the first boundary A1 (or the second boundary A2) of the slidable region 101a1, the more the phototransistors 1031 included in each detection circuit 103. The smaller the length, in the second direction Y, of the peripheral region 101b close to the first boundary A1 (or the second boundary A2) of the slidable region 101a1, the fewer the phototransistors 1031 included in each detection circuit 103.

Referring to FIG. 1, extension directions of the first boundary A1 and the second boundary A2 are both the first direction X. The slidable region 101a1 further has a third boundary A3 and a fourth boundary A4 in addition to the first boundary A1 and the second boundary A2. An extension direction of the third boundary A3 and an extension direction of the fourth boundary A4 are both the second direction Y. The third boundary A3 is farther away from the fixed region 101a2 than the fourth boundary A4.

Figure 7:
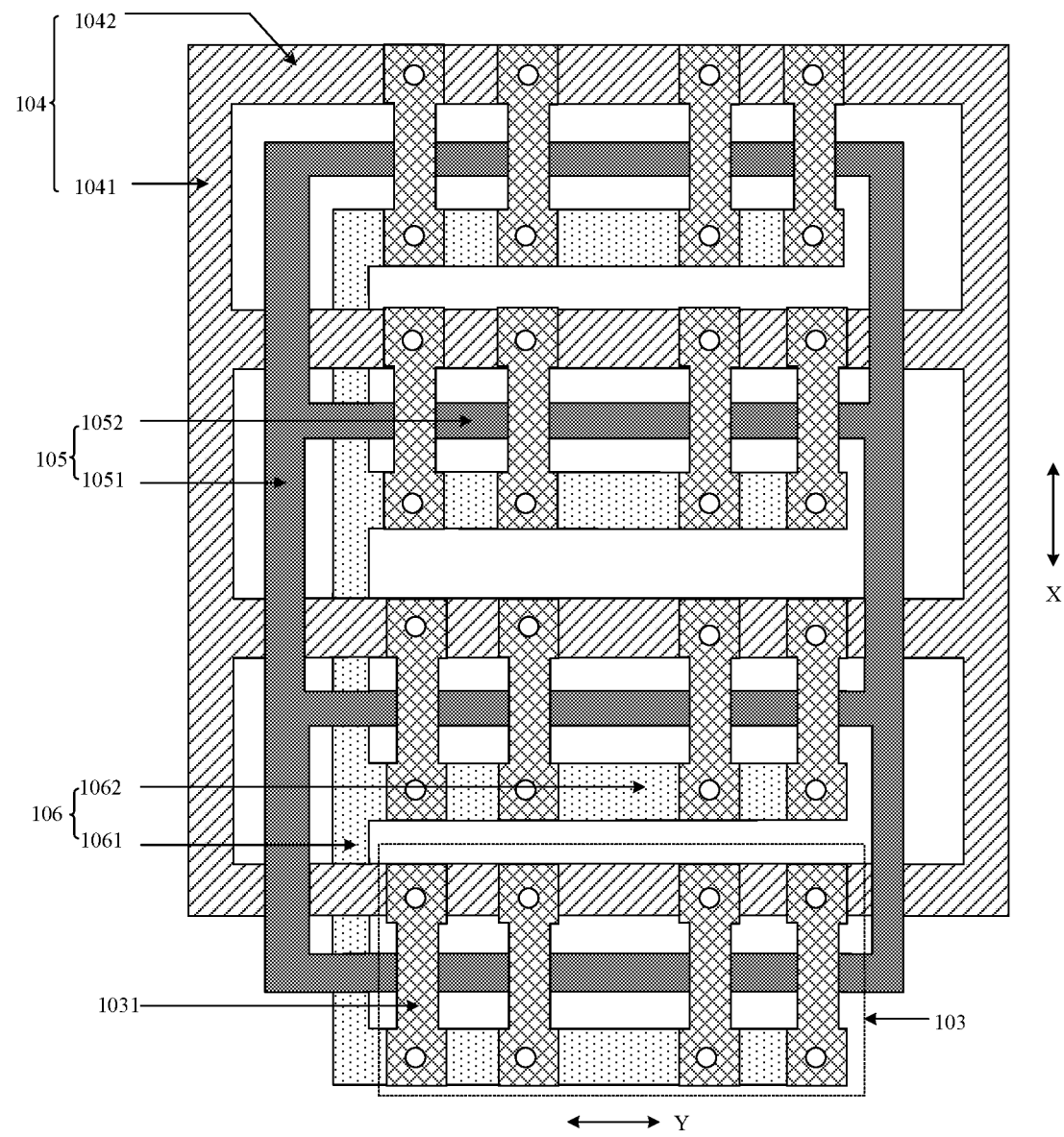
FIG. 7 is a schematic diagram of a partial structure of a plurality of detection circuits, an input signal line, a control signal line, and a detection signal line according to some embodiments of the present disclosure.
Figure 8:
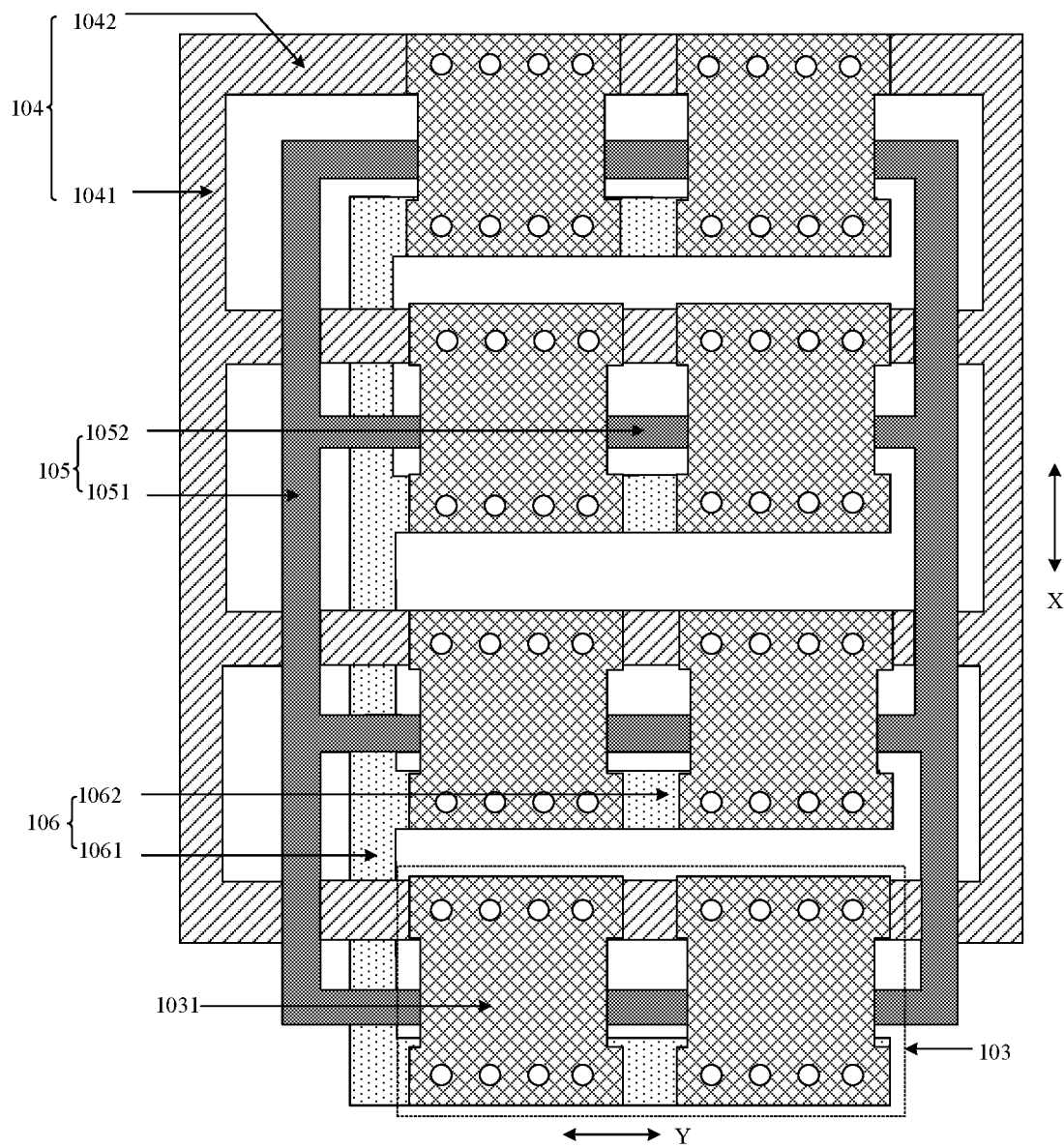
FIG. 8 is a schematic diagram of another partial structure of a plurality of detection circuits, an input signal line, a control signal line, and a detection signal line according to some embodiments of the present disclosure.
Figure 9:
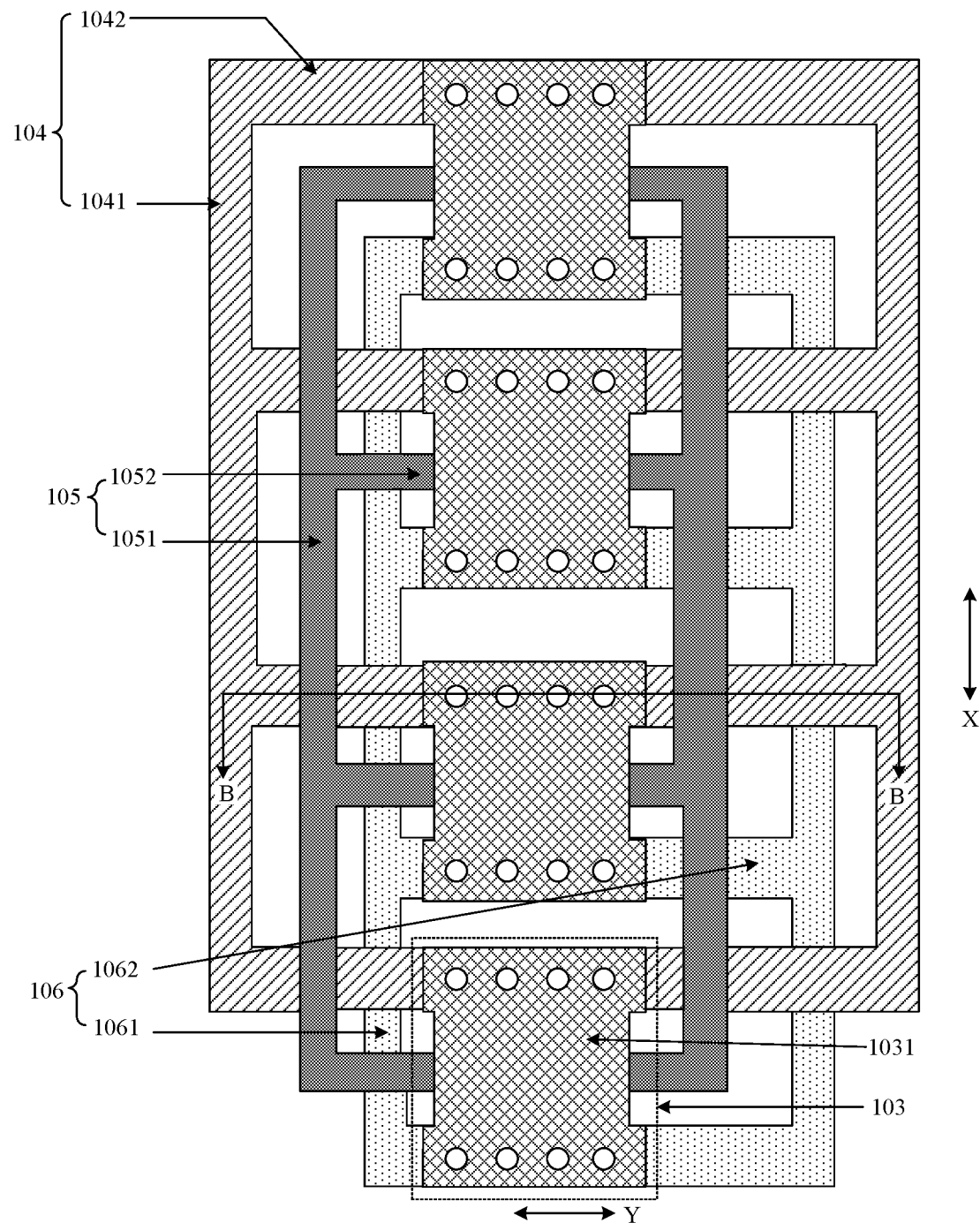
FIG. 9 is a schematic diagram of still another partial structure of a plurality of detection circuits, an input signal line, a control signal line, and a detection signal line according to some embodiments of the present disclosure.

In the embodiments of the present disclosure, referring to FIG. 7 to FIG. 9, each detection circuit 103 in FIG. 7 includes four phototransistors 1031, each detection circuit 103 in FIG. 8 includes two phototransistors 1031, and each detection circuit 103 in FIG. 9 includes one phototransistor 1031. The phototransistor 1031 in the detection circuit 103 in FIG. 8 and FIG. 9 has a big width-to-length ratio, while the phototransistor 1031 in the detection circuit 103 in FIG. 7 has a small width-to-length ratio. The width-to-length ratio of the phototransistor 1031 is a ratio of a width to a length of a channel region of the phototransistor 1031.

Optionally, because the phototransistor 1031 in the detection circuit 103 in FIG. 8 and FIG. 9 has a big width-to-length ratio, the change in the detection current that is detected by the driver IC 102 is large even if fewer phototransistors 1031 are arranged in the detection circuit 103. Therefore, in the case that the length, in the second direction Y, of the peripheral region 101b close to the slidable region 101a1 is small, the phototransistor 1031 with a big width-to-length ratio is preferentially selected, to reduce space occupied by the detection circuit 103.

Optionally, the width-to-length ratio of the phototransistor 1031 in FIG. 7 is 1:1. The width-to-length ratio of the phototransistor 1031 in FIG. 8 and FIG. 9 ranges from 5:1 to 10:1.

In the embodiments of the present disclosure, each detection circuit 103 alternatively includes other number of phototransistors 1031, which is not limited in the embodiments of the present disclosure, as long as it is ensured that the driver IC 102 accurately detects the detection current in the detection signal line 106.

Referring to FIG. 7 to FIG. 9, each input signal line 104 includes at least one first input line segment 1041 and a plurality of second input line segments 1042. Each of the second input line segments 1042 is connected to at least one first input line segment 1041. Each first input line segment 1041 is extended in the first direction X, and each second input line segment 1042 is extended in the second direction Y. The first electrode of each phototransistor 1031 is electrically connected to one of the second input line segments 1042. In addition, the driver IC 102 is connected to the first input line segment 1041. The driver IC 102 provides the input signal to the first electrode of the phototransistor 1031 through the first input line segment 1041 and the second input line segment 1042.

Optionally, referring to FIG. 7 to FIG. 9, each input signal line 104 includes two first input line segments 1041. One end of each second input line segment 1042 is connected to one of the first input line segments 1041 and the other end is connected to the other one of the first input line segments 1041.

The input signal line 104 includes the two first input line segments 1041, and the two first input line segments 1041 are respectively connected to the two ends of the second input line segment 1042 such that one end of each second input line segment 1042 is prevented from being suspended. This not only improves the symmetry of the input signal line 104, but also ensure stability of the input signal transmitted by the input signal line 104.

Certainly, each input signal line 104 alternatively includes only one first input line segment 1041 or more first input line segments 1041, which is not limited in the embodiments of the present disclosure.

Optionally, the number of the second input line segments 1042 included in each input signal line 104 is the same as the number of the detection circuits 103 connected to the input signal line 104. Certainly, the number of the second input line segments 1042 included in each input signal line 104 is alternatively different from the number of the detection circuits 103 connected to the input signal line 104, which is not limited in the embodiments of the present disclosure.

Referring to FIG. 7 to FIG. 9, each control signal line 105 includes at least one first control line segment 1051 and a plurality of second control line segments 1052. Each of the second control line segments 1052 is connected to at least one first control line segment 1051. Each first control line segment 1051 is extended in the first direction X, and each second control line segment 1052 is extended in the second direction Y. The gate of each phototransistor 1031 is electrically connected to one of the second control line segments 1052. In addition, the driver IC 102 is connected to the first control line segment 1051. The driver IC 102 provides the control signal to the gate of the phototransistor 1031 through the first control line segment 1051 and the second control line segment 1052.

Optionally, referring to FIG. 7 to FIG. 8, each control signal line 105 includes two first control line segments 1051. One end of each second control line segment 1052 is connected to one of the first control line segments 1051 and the other end is connected to the other one of the first control line segments 1051.

The control signal line 105 includes the two first control line segments 1051, and the two first control line segments 1051 are respectively connected to the two ends of the second control line segment 1052 such that one end of each second control line segment 1052 is prevented from being suspended. This not only improves symmetry of the control signal line 105, but also ensure stability of the control signal transmitted by the control signal line 105.

Certainly, each control signal line 105 alternatively includes only one first control line segment 1051 or more first control line segments 1051, which is not limited in the embodiments of the present disclosure.

Optionally, the number of the second control line segments 1052 included in each control signal line 105 is the same as the number of the detection circuits 103 connected to the control signal line 105. Certainly, the number of the second control line segments 1052 included in each control signal line 105 is alternatively different from the number of the detection circuits 103 connected to the control signal line 105, which is not limited in the embodiments of the present disclosure.

Referring to FIG. 7 to FIG. 9, each detection signal line 106 includes at least one first detection line segment 1061 and a plurality of second detection line segments 1062. Each of the second detection line segments 106 is connected to at least one first detection line segment 1061. Each first detection line segment 1061 is extended in the first direction X, and each second detection line segment 1062 is extended in the second direction Y. The second electrode of each phototransistor 1031 is electrically connected to one of the second detection line segments 1062. In addition, the driver IC 102 is connected to the first detection line segment 1061. The driver IC 102 receives the detection current transmitted by the phototransistor 1031 through the second detection line segment 1062 and the first detection line segment 1061.

Optionally, referring to FIG. 9, each detection signal line 106 includes two first detection line segments 1061. One end of each second detection line segment 1062 is connected to one of the first detection line segments 1061 and the other end is connected to the other one of the first detection line segments 1061.

The detection signal line 106 includes the two first detection line segments 1061, and the two first detection line segments 1061 are respectively connected to the two ends of the second detection line segment 1062 such that one end of each second detection line segment 1062 is prevented from being suspended. This not only improves symmetry of the detection signal line 106, but also ensure stability of the detection current transmitted by the detection signal line 106.

Certainly, referring to FIG. 7 and FIG. 8, each detection signal line 106 alternatively includes only one first detection line segment 1061 or more first detection line segments 1061, which is not limited in the embodiments of the present disclosure.

Optionally, the number of the second detection line segments 1062 included in each detection signal line 106 is the same as the number of the detection circuits 103 connected to the detection signal line 106. Certainly, the number of the second detection line segments 1062 included in each detection signal line 106 is alternatively different from the number of the detection circuits 103 connected to the detection signal line 106, which is not limited in the embodiments of the present disclosure.

Figure 10:
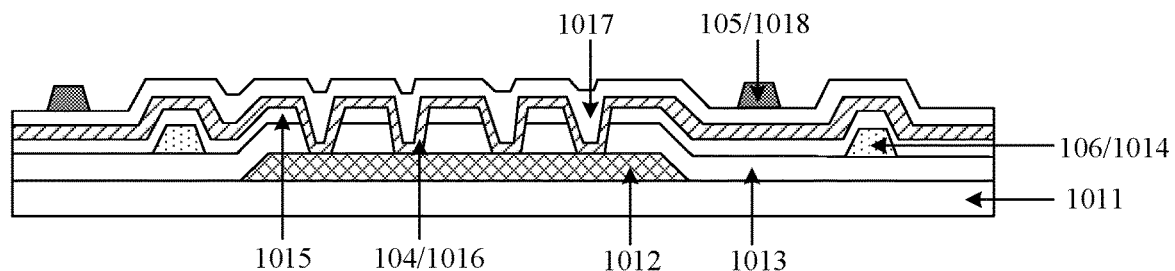
FIG. 10 is a partial sectional view of a flexible display panel according to some embodiments of the present disclosure.
Figure 11:
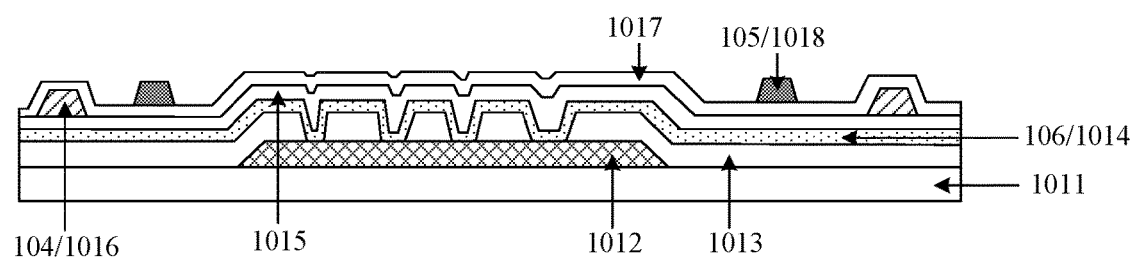
FIG. 11 is another partial sectional view of a flexible display panel according to some embodiments of the present disclosure.
Figure 12:
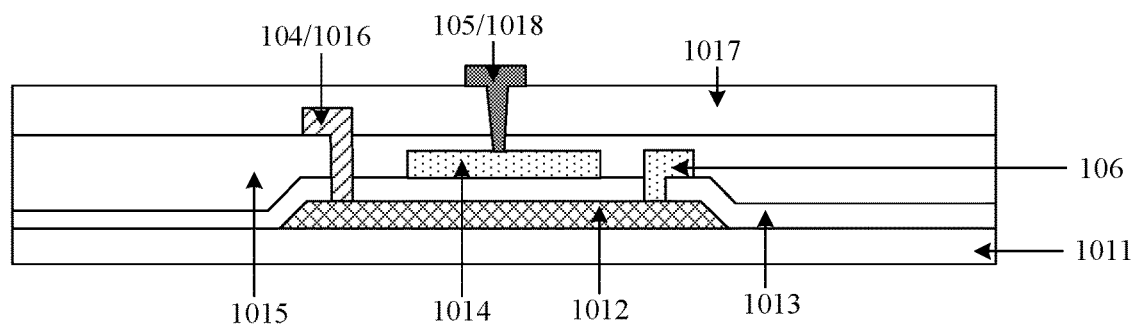
FIG. 12 is still another partial sectional view of a flexible display panel according to some embodiments of the present disclosure.

FIG. 10 is a partial sectional view of a flexible display panel according to some embodiments of the present disclosure. FIG. 11 is another partial sectional view of a flexible display panel according to some embodiments of the present disclosure. FIG. 12 is still another partial sectional view of a flexible display panel according to some embodiments of the present disclosure. Referring to FIG. 10 to FIG. 12, the flexible display panel 101 includes a first substrate 1011, and a first active layer 1012, a first insulation layer 1013, a first gate layer 1014, a second insulation layer 1015, a first metal layer 1016, a third insulation layer 1017, and a second metal layer 1018 that are sequentially stacked in a direction away from the first substrate 1011. FIG. 10 is a sectional view along the BB direction in FIG. 9. FIG. 11 is a sectional view along the CC direction in FIG. 9. FIG. 12 is a sectional view along the DD direction in FIG. 9.

The first active layer 1012 includes active patterns of the phototransistors 1031. A gap is formed between the active patterns of the phototransistors 1031. The active pattern of each phototransistor 1031 includes the channel region, the first electrode, and the second electrode. An orthographic projection of the gate of the phototransistor 1031 on the first substrate 1011 is within the channel region. For each phototransistor 1031, the first electrode of the phototransistor 1031 is electrically connected to an input signal line 104, and the second electrode of the phototransistor 1031 is electrically connected to a detection signal line 106.

Referring to FIG. 9 to FIG. 12, the at least one detection signal line 106 is disposed in the first gate layer 1014. The at least one detection signal line 106 is electrically connected to the second electrode through at least one first via hole in the first insulation layer 1013. For example, in FIG. 11, the detection signal line 106 is electrically connected to the second electrode through four first via holes in the first insulation layer 1013.

The at least one detection signal line 106 being disposed in the first gate layer 1014 refers to that the at least one detection signal line 106 is made of the same material and manufactured through the same patterning process as the gate of the phototransistor 1031. In addition, because the phototransistor 1031 is integrated in the flexible display panel 101, the flexible display panel 101 further includes subpixels in the display region 101a. The at least one detection signal line 106 is alternatively made of the same material and manufactured through the same patterning process as a gate of a thin film transistor of a pixel circuit in the subpixel.

Referring to FIG. 9 to FIG. 12, the at least one input signal line 104 is disposed in the first metal layer 1016. The at least one input signal line 104 is electrically connected to the first electrode through at least one second via hole in the first insulation layer 1013 and the second insulation layer 1015. For example, in FIG. 10, the input signal line 104 is electrically connected to the first electrode through four second via holes in the first insulation layer 1013 and the second insulation layer 1015.

The first metal layer 1016 is a first source-drain layer. The thin film transistor of the pixel circuit in the subpixel in the flexible display panel 101 further includes a source and a drain. The at least one input signal line 104 being disposed in the first metal layer 1016 refers to that the at least one input signal line 104 is made of the same material and manufactured through the same patterning process as the source and the drain of the thin film transistor of the pixel circuit in the subpixel.

Referring to FIG. 9 to FIG. 12, the at least one control signal line 105 is disposed in the second metal layer 1018. The at least one control signal line 105 is electrically connected to the gate of the phototransistor 1031 through at least one third via hole in the first insulation layer 1013, the second insulation layer 1015, and the third insulation layer 1017 (not shown in the figure).

The second metal layer 1018 is a second source-drain layer. The source of the thin film transistor of the pixel circuit in the subpixel in the flexible display panel 101 is electrically connected to a data line of the second source-drain layer. The at least one control signal line 105 being disposed in the second metal layer 1018 refers to that the at least one control signal line 105 is made of the same material and manufactured through the same patterning process as the data line.

Figure 13:
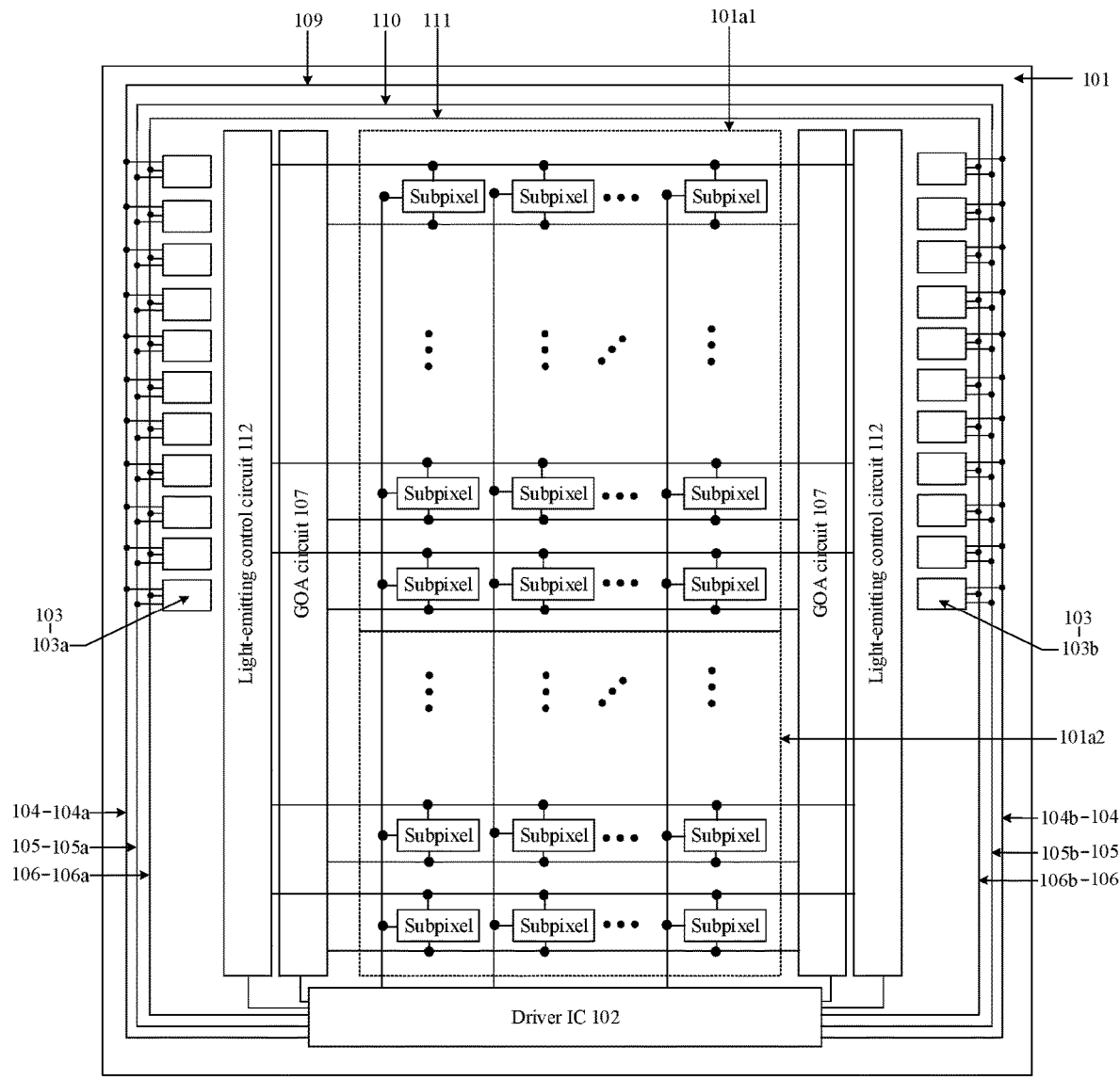
FIG. 13 is a schematic structural diagram of another display device according to some embodiments of the present disclosure.

FIG. 13 is a schematic structural diagram of another display device according to some embodiments of the present disclosure. Referring to FIG. 13, the display device 10 further includes a GOA circuit 107 integrated in the flexible display panel 101. The GOA circuit 107 is closer to the slidable region 101a1 than the plurality of detection circuits 103 are. That is, the GOA circuit 107 is disposed between the plurality of detection circuits 103 and the slidable region 101a1. Alternatively, the GOA circuit 107 is farther from the slidable region 101a1 than the plurality of detection circuits 103 are. That is, the GOA circuit 107 is disposed on the side of the plurality of detection circuits 103 away from the slidable region 101a1, and the plurality of detection circuits 103 are disposed between the GOA circuit 107 and the slidable region 101a1.

Figure 14:
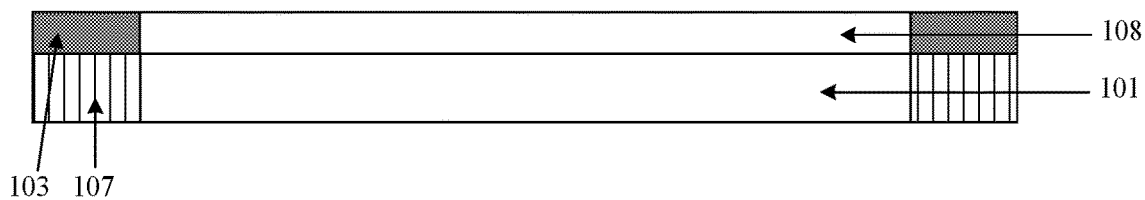
FIG. 14 is a schematic structural diagram of still another display device according to some embodiments of the present disclosure.

FIG. 14 is a schematic structural diagram of still another display device according to some embodiments of the present disclosure. Referring to FIG. 14, the display device 10 further includes a touch panel 108 disposed on a display side of the flexible display panel 101.

Figure 15:
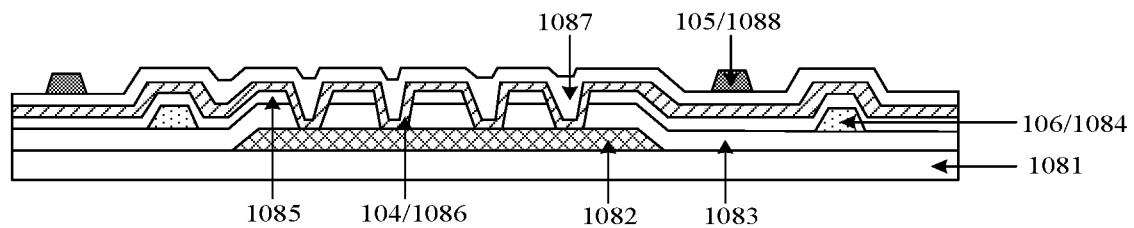
FIG. 15 is a partial sectional view of a touch panel according to some embodiments of the present disclosure.
Figure 16:
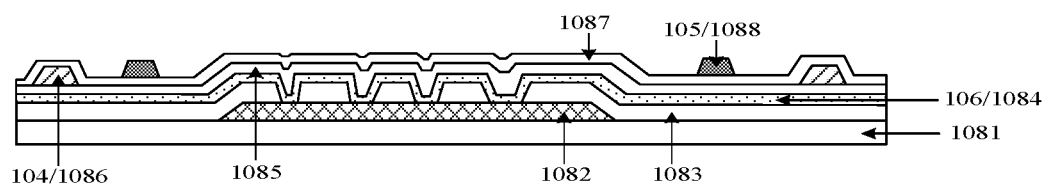
FIG. 16 is another partial sectional view of a touch panel according to some embodiments of the present disclosure.
Figure 17:
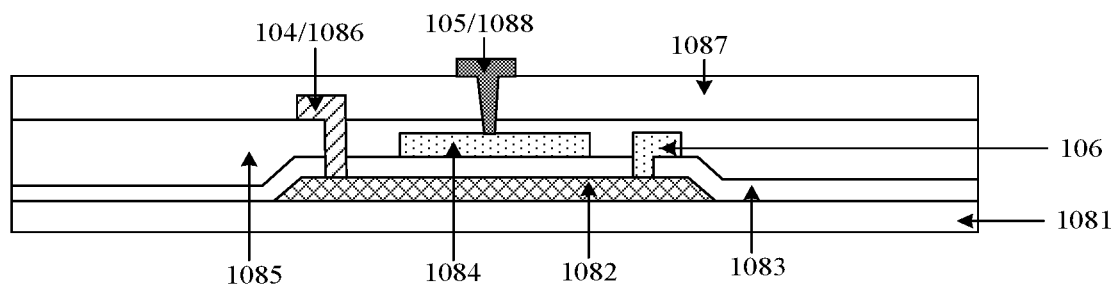
FIG. 17 is still another partial sectional view of a touch panel according to some embodiments of the present disclosure.

FIG. 15 is a partial sectional view of a touch panel according to some embodiments of the present disclosure. FIG. 16 is another partial sectional view of a touch panel according to some embodiments of the present disclosure. FIG. 17 is still another partial sectional view of a touch panel according to some embodiments of the present disclosure. Referring to FIG. 15 to FIG. 17, the touch panel 108 includes a second substrate 1081, and a second active layer 1082, a fourth insulation layer 1083, a second gate layer 1084, a fifth insulation layer 1085, a third metal layer 1086, a sixth insulation layer 1087, and a fourth metal layer 1088 that are sequentially stacked in a direction away from the second substrate 1081. FIG. 15 is a sectional view along the BB direction in FIG. 9. FIG. 16 is a sectional view along the CC direction in FIG. 9. FIG. 17 is a sectional view along the DD direction in FIG. 9.

Figure 18:
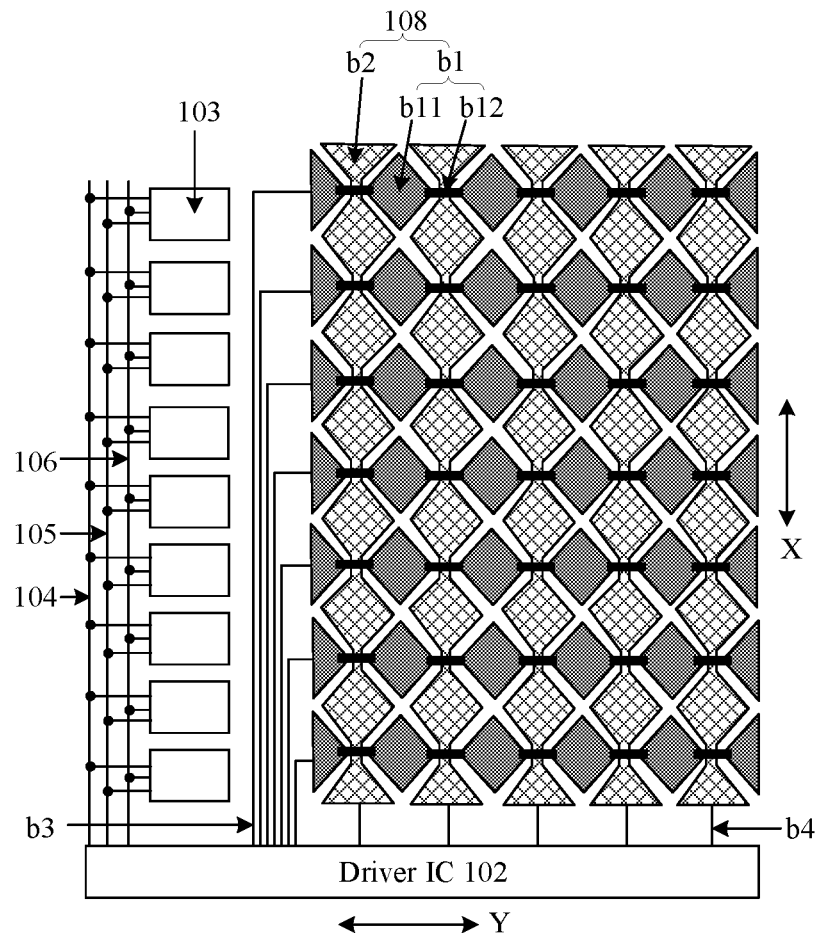
FIG. 18 is a partial top view of a touch panel according to some embodiments of the present disclosure.

Referring to FIG. 18, the touch panel 108 includes a plurality of first touch electrodes b1 and a plurality of second touch electrodes b2 that are insulated from each other. The plurality of first touch electrodes b1 are arranged in the first direction X, and the plurality of second touch electrodes b2 are arranged in the second direction Y. The first touch electrode b1 includes a plurality of touch patterns b11 arranged in the second direction Y and a bridge b12 connected to the plurality of touch patterns b11.

Optionally, the plurality of touch patterns b11 of the first touch electrode b1 and the second touch electrode b2 are disposed in a first touch metal layer, and the bridge b12 is disposed in a second touch metal layer. An insulation layer (for example, the third insulation layer 1017) is disposed between the first touch metal layer and the second touch metal layer. The bridge b12 is connected to the plurality of touch patterns b11 through a via hole in the insulation layer.

In addition, the touch panel 108 further includes a first touch trace b3 and a second touch trace b4, and the first end of the first touch trace b3 is electrically connected to the first touch electrode b1, and the first end of a second touch trace b4 is electrically connected to the second touch electrode b2. The second end of the first touch trace b3 and the second end of the second touch trace b4 are connected to touch interfaces, and the connected touch interfaces are different. In addition, the driver IC 102 is connected to the first touch trace b3 and the second touch trace b4 through the touch interfaces. The touch interfaces are not shown in FIG. 18.

Optionally, the first touch electrode b1 is a drive (Tx) electrode, and the second touch electrode b2 is a sensing (Rx) electrode. Alternatively, the first touch electrode b1 is a sensing electrode, and the second touch electrode b2 is a drive electrode, which is not limited in the embodiments of the present disclosure.

In the embodiments of the present disclosure, the second active layer 1082 includes the active patterns of the phototransistors 1031. A gap is formed between the active patterns of the phototransistors 1031. The active pattern of each phototransistor 1031 includes the channel region, the first electrode, and the second electrode. An orthographic projection of the gate of the phototransistor 1031 on the second substrate 1081 is within the channel region. For each phototransistor 1031, the first electrode of the phototransistor 1031 is electrically connected to an input signal line 104, and the second electrode of the phototransistor 1031 is electrically connected to a detection signal line 106.

Referring to FIG. 15 to FIG. 17, the at least one detection signal line 106 is disposed in the second gate layer 1084. The at least one detection signal line 106 is electrically connected to the second electrode through at least one first via hole in the fourth insulation layer 1083. For example, in FIG. 16, the detection signal line 106 is electrically connected to the second electrode through four first via holes in the fourth insulation layer 1083. The first gate layer 1014 is a new layer of the touch panel 108.

Referring to FIG. 9 and FIG. 15 to FIG. 17, the at least one input signal line 104 is disposed in the third metal layer 1086. The at least one input signal line 104 is electrically connected to the first electrode through at least one second via hole in the fourth insulation layer 1083 and the fifth insulation layer 1085. For example, in FIG. 15, the input signal line 104 is electrically connected to the first electrode through four second via holes in the fourth insulation layer 1083 and the fifth insulation layer 1085.

The third metal layer 1086 is the first touch metal layer. The at least one input signal line 104 being disposed in the third metal layer 1086 refers to that the at least one input signal line 104 is made of the same material and manufactured through the same patterning process as a structure (for example, the plurality of touch patterns b11 of the first touch electrode b1 and the second touch electrode b2) in the first touch metal layer of the touch panel 108.

Referring to FIG. 9 and FIG. 15 to FIG. 17, the at least one control signal line 105 is disposed in the fourth metal layer 1088. The at least one control signal line 105 is electrically connected to the gate of the phototransistor 1031 through at least one third via hole in the fourth insulation layer 1083, the fifth insulation layer 1085, and the sixth insulation layer 1087 (not shown in the figure).

The fourth metal layer 1088 is the second touch metal layer. The at least one control signal line 105 being disposed in the fourth metal layer 1088 refers to that the at least one control signal line 105 is made of the same material and manufactured through the same patterning process as a structure (for example, the bridge b12 of the first touch electrode b1) in the second touch metal layer of the touch panel 108.

Referring to FIG. 14, the display device 10 further includes a GOA circuit 107 integrated in the flexible display panel 101. Because the phototransistors 1031 in the plurality of detection circuits 103 are integrated in the touch panel 108, orthographic projections of the plurality of detection circuits 103 on the flexible display panel 101 are within a region in which the GOA circuit 107 is located. Certainly, the orthographic projections of the plurality of detection circuits 103 on the flexible display panel 101 is alternatively not within the region in which the GOA circuit 107 is located, which is not limited in the embodiments of the present disclosure.

Referring to FIG. 13, the plurality of detection circuits 103 includes a plurality of first detection circuits 103a and a plurality of second detection circuits 103b. The at least one input signal line 104 includes a first input signal line 104a and a second input signal line 104b. The at least one control signal line 105 includes a first control signal line 105a and a second control signal line 105b. The at least one detection signal line 106 includes a first detection signal line 106a and a second detection signal line 106b.

The plurality of first detection circuits 103a, the first input signal line 104a, the first control signal line 105a, and the first detection signal line 106a are all disposed in the peripheral region 101b and close to the first boundary A1 of the slidable region 101a1. The first detection circuits 103a are electrically connected to the first input signal line 104a, the first control signal line 105a, and the first detection signal line 106a. Therefore, the driver IC 102 provides input signals to the first detection circuits 103a through the first input signal line 104a and provide the control signals to the first detection circuits 103a through the first control signal line 105a. In addition, the driver IC 102 receives the detection current transmitted by the first detection circuits 103a through the first detection signal line 106a.

The plurality of second detection circuits 103b, the second input signal line 104b, the second control signal line 105b, and the second detection signal line 106b are all disposed in the peripheral region 101b and close to the second boundary A2 of the slidable region 101a1. The second detection circuits 103b are electrically connected to the second input signal line 104b, the second control signal line 105b, and the second detection signal line 106b. Therefore, the driver IC 102 provides the input signals to the second detection circuits 103b through the second input signal line 104b and provide the control signals to the second detection circuits 103b through the second control signal line 105b. In addition, the driver IC 102 receives the detection current transmitted by the second detection circuits 103b through the second detection signal line 106b.

Referring to FIG. 13, the plurality of first detection circuits 103a and the plurality of second detection circuits 103b are symmetrically arranged with respect to an axis of the slidable region 101a1. An extension direction of the axis is parallel to the first direction X. Optionally, the number of the first detection circuits 103a included in the display device is the same as the number of the second detection circuits 103b included in the display device, and the first detection circuits and the second detection circuits are symmetrically arranged one by one.

In the embodiments of the present disclosure, the plurality of first detection circuits 103a and the plurality of second detection circuits 103b are symmetrically arranged such that symmetry of the structure of the display device is improved.

The first input signal line 104a and the second input signal line 104b are also symmetrically arranged with respect to the axis. The first control signal line 105a and the second control signal line 105b are also symmetrically arranged with respect to the axis. The first detection signal line 106a and the second detection signal line 106b are also symmetrically arranged with respect to the axis. Certainly, the first input signal line 104a and the second input signal line 104b are also asymmetrically arranged, the first control signal line 105a and the second control signal line 105b are alternatively asymmetrically arranged, and the first detection signal line 106a and the second detection signal line 106b are alternatively asymmetrically arranged, which is not limited in the embodiments of the present disclosure.

In the embodiments of the present disclosure, referring to FIG. 13, the display device 10 further includes an input signal connection line 109, a control signal connection line 110, and a detection signal connection line 111. The first input signal line 104a and the second input signal line 104b are connected through the input signal connection line 109, the first control signal line 105a and the second control signal line 105b are connected through the control signal connection line 110, and the first detection signal line 106a and the second detection signal line 106b are connected through the detection signal connection line 111.

The first input signal line 104a and the second input signal line 104b provided on two sides are connected through the input signal connection line 109, the first control signal line 105a and the second control signal line 105b provided on two sides are connected through the control signal connection line 110, and the first detection signal line 106a and the second detection signal line 106b provided on two sides are connected through the detection signal connection line 111 such that consistency of the signals transmitted through the signal lines provided on the two sides is ensured, thereby ensuring the detection accuracy of the detection circuit 103.

For example, the consistency of the signals transmitted through the first input signal line 104a and the second input signal line 104b, the consistency of the signals transmitted through the first control signal line 105a and the second control signal line 105b, and the consistency of the signals transmitted through the first detection signal line 106a and the second detection signal line 106b is ensured.

The input signal connection line 109, the control signal connection line 110, and the detection signal connection line 111 are all disposed in the peripheral region 101b that is on a side of the slidable region 101a1 away from the fixed region 101a2. That is, the input signal connection line 109, the control signal connection line 110, and the detection signal connection line 111 are all disposed in the peripheral region 101b close to the third boundary A3 of the slidable region 101a1.

Referring to FIG. 13, the display device 10 further includes a light-emitting control circuit 112. The light-emitting control circuit 112 is connected to the plurality of subpixels in the flexible display panel 10 to provide light-emitting control signals to the plurality of subpixels.

In summary, the embodiments of the present disclosure provide the display device. In the process of rolling up or unrolling the slidable region of the flexible display panel of the display device, each detection circuit detects the external ambient light in real time, and transmit the detection current to the detection signal line based on the input signal provided by the input signal line when the external ambient light is detected. Therefore, the driver IC detects, from the detection signal line, the magnitude of the detection current transmitted by the detection circuit, and further determine the length of the effective display region of the flexible display panel in the first direction based on the correspondence between the current range and the length of the effective display region in the first direction. The driver IC controls the effective display region to display images based on the length of the effective display region in the first direction, and the flexibility is high.

Figure 19:
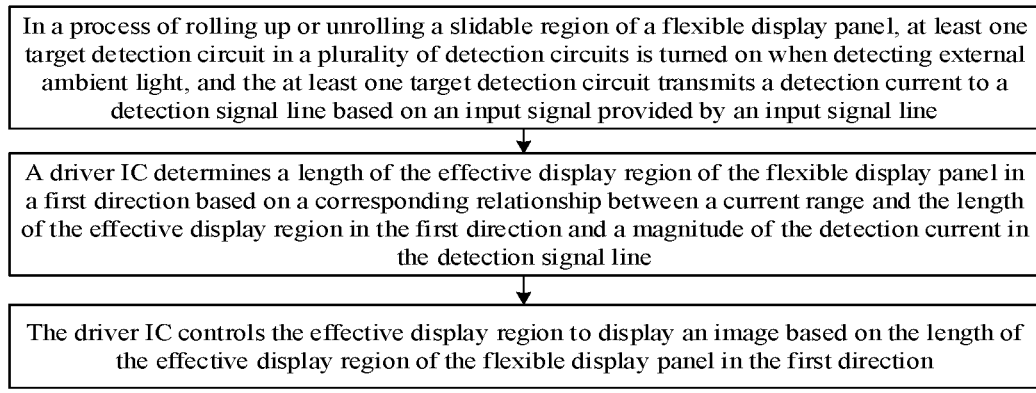
FIG. 19 is a flowchart of a method for controlling a display device according to some embodiments of the present disclosure.

FIG. 19 is a flowchart of a method for controlling a display device according to some embodiments of the present disclosure. The method is applied to the display device according to the foregoing embodiments. Referring to FIG. 19, the method includes the following steps.

In step 201, in a process of rolling up or unrolling a slidable region of a flexible display panel, at least one target detection circuit in a plurality of detection circuits is turned on when detecting external ambient light, and the at least one target detection circuit transmits a detection current to a detection signal line based on an input signal provided by an input signal line.

In the embodiments of the present disclosure, each target detection circuit is disposed in the peripheral region 101b of the flexible display panel that is proximate to the slidable region in the effective display region. The target detection circuit is an exposed detection circuit in the plurality of detection circuits 103. The exposed target detection circuit is turned on when detecting the external ambient light, and transmit the detection current to the detection signal line based on the input signal provided by the input signal line.

In the process of rolling up the slidable region 101a1 of the flexible display panel 101, the number of exposed target detection circuits gradually decreases; and in the process of unrolling the slidable region 101a1 of the flexible display panel 101, the number of exposed target detection circuits gradually increases. Therefore, in the process of rolling up the slidable region 101a1 of the flexible display panel 101, the detection current transmitted to the detection signal line based on the input signal provided by the input signal line gradually decreases; and in the process of unrolling the slidable region 101a1 of the flexible display panel 101, the detection current transmitted to the detection signal line based on the input signal provided by the input signal line gradually increases.

In step 202, a driver IC determines a length of the effective display region of the flexible display panel in a first direction based on a corresponding relationship between a current range and the length of the effective display region in the first direction and a magnitude of the detection current in the detection signal line.

In the embodiments of the present disclosure, the driver IC 102 stores the corresponding relationship between the current range and the length of the effective display region in the first direction. The detection current transmitted by the at least one target detection circuit to the detection signal line 106 based on the input signal provided by the input signal line 104 is transmitted to the driver IC 102. The driver IC 102 determines a target current range within which the magnitude of the detection current received from the detection signal line 106 falls based on the corresponding relationship, and determines a target length corresponding to the target current range as the length of the effective display region of the flexible display panel 101 in the first direction X.

Optionally, the magnitude of the detection current in the detection signal line 106 is positively correlated with the number of target detection circuits in the plurality of detection circuits 103. The length of the effective display region in the first direction X is positively correlated with the magnitude of the detection current in the detection signal line 106.

Therefore, in the process of rolling up the slidable region 101a1 of the flexible display panel 101, the number of target detection circuits gradually decreases such that the magnitude of the detection current in the detection signal line 106 gradually decreases, and the length of the effective display region in the first direction X also gradually decreases. In the process of unrolling the slidable region 101a1 of the flexible display panel 101, the number of target detection circuits gradually increases such that the magnitude of the detection current in the detection signal line 106 gradually increases, and the length of the effective display region in the first direction X also gradually increases.

In step 203, the driver IC controls the effective display region to display an image based on the length of the flexible display panel in the first direction.

In the embodiments of the present disclosure, after determining the length of the effective display region of the flexible display panel 101 in the first direction X, the driver IC 102 controls the effective display region to display the image based on the length, and controls other regions in the display region except the effective display region not to display an image.

In summary, the embodiments of the present disclosure provide the method for controlling a display device. In the process of rolling up or unrolling the slidable region of the flexible display panel of the display device, each detection circuit detects the external ambient light in real time, and transmit the detection current to the detection signal line based on the input signal provided by the input signal line when detecting the external ambient light. Therefore, the driver IC detects, from the detection signal line, the magnitude of the detection current transmitted by the detection circuit, and further determine the length of the effective display region of the flexible display panel in the first direction based on the corresponding relationship between the current range and the length of the effective display region in the first direction. The driver IC controls, based on the length of the effective display region in the first direction, the effective display region to display the image, and the flexibility is high.

Figure 20:
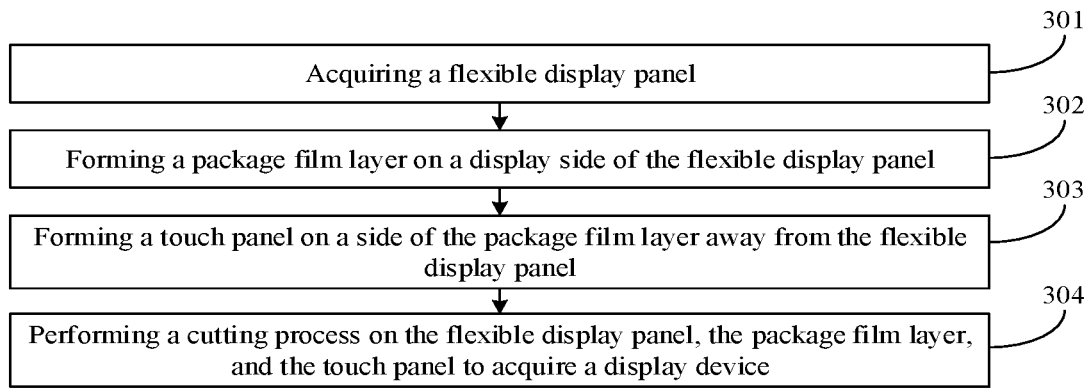
FIG. 20 is a flowchart of a method for manufacturing a display device according to some embodiments of the present disclosure.

FIG. 20 is a flowchart of a method for manufacturing a display device according to some embodiments of the present disclosure. The method is used to manufacture a display device with a touch panel 108 in which a plurality of detection circuits 103 are integrated. Referring to FIG. 20, the method includes the following steps.

In step 301, a flexible display panel is acquired.

In step 302, a package film layer is formed on a display side of the flexible display panel.

In the embodiments of the present disclosure, the package film layer is configured to package the flexible display panel. The package film layer includes a first inorganic material layer, an organic material layer, and a second inorganic material layer that are sequentially stacked in a direction away from the flexible display panel.

In step 303, a touch panel is formed on a side of the package film layer away from the flexible display panel.

Figure 21:
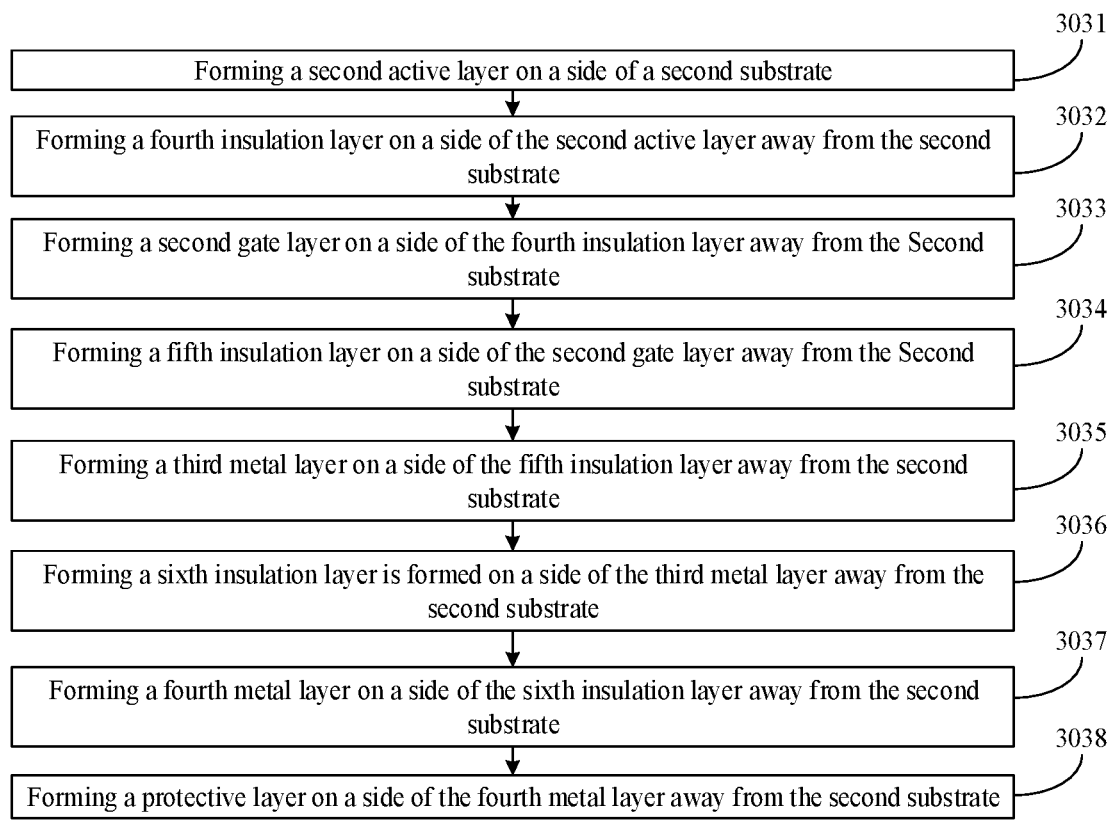
FIG. 21 is a flowchart of a method for manufacturing a touch panel according to some embodiments of the present disclosure.

In the embodiments of the present disclosure, referring to FIG. 21, the process of forming the touch panel includes the following steps.

In step 3031, a second active layer is formed on a side of a second substrate.

In the embodiments of the present disclosure, an active film layer is formed on a side of the second substrate 1081 through deposition, and the active film layer is patterned by using a first mask to acquire a second active layer 1082. The second active layer 1082 includes the active patterns of the phototransistors 1031 of the detection circuits 103. A gap is formed between the active patterns of the phototransistors 1031. The active pattern of each phototransistor 1031 includes a channel region, a first electrode, and a second electrode.

In step 3032, a fourth insulation layer is formed on a side of the second active layer away from the second substrate.

In the embodiments of the present disclosure, the fourth insulation layer 1083 is formed on the side of the second active layer 1082 away from the second substrate 1081 through deposition.

In step 3033, a second gate layer is formed on a side of the fourth insulation layer away from the second substrate.

In the embodiments of the present disclosure, a gate film layer is formed on the side of the fourth insulation layer 1083 away from the second substrate 1081 through deposition, and the gate film layer is patterned by using a second mask to acquire the second gate layer 1081. The second gate layer 1081 includes gate patterns of the phototransistors 1031 of the detection circuits 103. An orthographic projection of the gate pattern on the flexible display panel 101 is within the channel region.

At least one detection signal line 106 is disposed in the second gate layer 1084. The at least one detection signal line 106 is electrically connected to the second electrode through at least one first via hole in the fourth insulation layer 1083. For example, the detection signal line 106 is electrically connected to the second electrode through four first via holes in the fourth insulation layer 1083.

In step 3034, a fifth insulation layer is formed on a side of the second gate layer away from the second substrate.

In the embodiments of the present disclosure, the fifth insulation layer 1085 is formed on the side of the second gate layer 1081 away from the second substrate 1081 through deposition.

In step 3035, a third metal layer is formed on a side of the fifth insulation layer away from the second substrate.

In the embodiments of the present disclosure, at least one input signal line 104 is disposed in the third metal layer 1086. The at least one input signal line 104 is electrically connected to the first electrode through at least one second via hole in the fourth insulation layer 1083 and the fifth insulation layer 1085. For example, the input signal line 104 is electrically connected to the first electrode through four second via holes in the fourth insulation layer 1083 and the fifth insulation layer 1085.

The third metal layer 1086 is a first touch metal layer. The at least one input signal line 104 being disposed in the third metal layer 1086 refers to that the at least one input signal line 104 is made of the same material and manufactured through the same patterning process as a structure (for example, the plurality of touch patterns b11 of a first touch electrode b1 and a second touch electrode b2) in the first touch metal layer in the touch panel 108.

In step 3036, a sixth insulation layer is formed on a side of the third metal layer away from the second substrate.

In step 3037, a fourth metal layer is formed on a side of the sixth insulation layer away from the second substrate.

In the embodiments of the present disclosure, at least one control signal line 105 is disposed in the fourth metal layer 1088. The at least one control signal line 105 is electrically connected to the gate of the phototransistor 1031 through at least one third via hole in the fourth insulation layer 1083, the fifth insulation layer 1085, and the sixth insulation layer 1087.

The fourth metal layer 1088 is a second touch metal layer. The at least one control signal line 105 being disposed in the fourth metal layer 1088 refers to that the at least one control signal line 105 is made of the same material and manufactured through the same patterning process as a structure (for example, a bridge b12 of the first touch electrode b1) in the second touch metal layer in the touch panel 108.

In step 3038, a protective layer is formed on a side of the fourth metal layer away from the second substrate.

In the embodiments of the present disclosure, the protective layer is configured to protect the touch panel 108. The protective layer is made of an insulation material.

In step 304, a cutting process is performed on the flexible display panel, the package film layer, and the touch panel to acquire a display device.

It can be known according to the foregoing manufacturing method that two masks (the first mask for preparing the active layer and the second mask for preparing the gate layer) and four times of deposition (depositing the active layer, depositing the gate layer, depositing the first insulation layer, and depositing the second insulation layer) need to be added in order to integrate the plurality of detection circuits 103 in the touch panel.

In summary, the embodiments of the present disclosure provide the method for manufacturing a display device. In the process of rolling up or unrolling the slidable region of the flexible display panel of the display device manufactured through the method, each detection circuit detects the external ambient light in real time, and transmit the detection current to the detection signal line based on the input signal provided by the input signal line when detecting the external ambient light. Therefore, the driver IC detects, from the detection signal line, the magnitude of the detection current transmitted by the detection circuit, and further determine the length of the effective display region of the flexible display panel in the first direction based on the corresponding relationship between the current range and the length of the effective display region in the first direction. The driver IC controls, based on the length of the effective display region in the first direction, the effective display region to display the image, and the flexibility is high.

The foregoing descriptions are merely optional embodiments of the present disclosure and are not intended to limit the present disclosure. Any modifications, equivalent replacements, and improvements and the like within the spirit and principle of the present disclosure shall be included within the protection scope of the present disclosure.

What is claimed is:

1. A display device, wherein the display device comprises:
a flexible display panel comprising a display region and a peripheral region surrounding the display region, wherein the display region comprises a slidable region and a fixed region;
a driver integrated circuit (IC) disposed in the peripheral region;
a plurality of detection circuits disposed in the peripheral region and close to the slidable region;
at least one input signal line, wherein one end of the at least one input signal line is electrically connected to the driver IC and the other end of the at least one input signal line is electrically connected to the plurality of detection circuits;
at least one control signal line, wherein one end of the at least one control signal line is electrically connected to the driver IC and the other end of the at least one control signal line is electrically connected to the plurality of detection circuits; and
at least one detection signal line, wherein one end of the at least one detection signal line is electrically connected to the driver IC and the other end of the at least one detection signal line is electrically connected to the plurality of detection circuits;
wherein each of the plurality of detection circuits is turned off under control of a control signal provided by the at least one control signal line, and is configured to transmit a detection current to the at least one detection signal line based on an input signal provided by the at least one input signal line when detecting external ambient light; the driver IC stores a corresponding relationship between a current range and a length of an effective display region in a first direction, wherein the effective display region comprises the fixed region and an expanded region of the slidable region, and the first direction is an arrangement direction of the slidable region and the fixed region; the driver IC is configured to determine the length of the effective display region of the flexible display panel in the first direction based on a magnitude of the detection current in the at least one detection signal line and the corresponding relationship and control the effective display region to display an image based on the length of the effective display region.

2. The display device according to claim 1, wherein each of the plurality of detection circuits comprises at least one phototransistor; wherein
a gate of the at least one phototransistor is electrically connected to the at least one control signal line, a first electrode of the at least one phototransistor is electrically connected to the at least one input signal line, and a second electrode of the at least one phototransistor is electrically connected to the at least one detection signal line.

3. The display device according to claim 2, wherein the plurality of detection circuits are arranged in the first direction; and each of the plurality of detection circuits comprises a plurality of phototransistors, wherein the plurality of the phototransistors are arranged in a second direction, and the second direction intersects the first direction.

4. The display device according to claim 2, wherein the at least one input signal line each comprises at least one first input line segment and a plurality of second input line segments, each of the plurality of second input line segments being connected to the at least one first input line segment; wherein
each of the at least one first input line segment is extended in the first direction, each of the plurality of second input line segments is extended in a second direction, and the first electrode of each of the at least one phototransistors is electrically connected to one of the plurality of second input line segments.

5. The display device according to claim 4, wherein the at least one input signal line each comprises two first input line segments; wherein
one end of each of the plurality of second input line segments is connected to one of the two first input line segments and the other end of each of the plurality of second input line segments is connected to the other one of the two first input line segments.

6. The display device according to claim 2, wherein the at least one control signal line each comprises at least one first control line segment and a plurality of second control line segments, each of the plurality of second control line segments being connected to the at least one first control line segment; wherein
each of the at least one first control line segment is extended in the first direction, each of the plurality of second control line segments is extended in a second direction, and the gate of each of the at least one phototransistors is electrically connected to one of the plurality of second control line segments.

7. The display device according to claim 6, wherein the at least one control signal line each comprises two first control line segments; wherein
one end of each of the plurality of second control line segments is connected to one of the two first control line segments and the other end of each of the plurality of second control line segments is connected to the other one of the two first control line segments.

8. The display device according to claim 2, wherein the at least one detection signal line each comprises at least one first detection line segment and a plurality of second detection line segments, each of the plurality of second detection line segments being connected to the at least one first detection line segment; wherein
each of the at least one first detection line segment is extended in the first direction, each of the plurality of second detection line segments is extended in a second direction, and the gate of each of the at least one phototransistors is electrically connected to one of the plurality of second detection line segments.

9. The display device according to claim 8, wherein the at least one detection signal line each comprises two first detection line segments; wherein
one end of each of the plurality of second detection line segments is connected to one of the two first detection line segments and the other end of each of the plurality of second detection line segments is connected to the other one of the two first detection line segments.

10. The display device according to claim 2, wherein the flexible display panel comprises a first substrate, and a first active layer, a first insulation layer, and a first gate layer that are sequentially stacked in a direction away from the first substrate; wherein
the first active layer comprises an active pattern of the at least one phototransistor, the active pattern comprises a channel region, the first electrode of the at least one phototransistor, and the second electrode of the at least one phototransistor, and an orthographic projection of the gate of the at least one phototransistor on the first substrate is within the channel region.

11. The display device according to claim 10, wherein the flexible display panel further comprises a second insulation layer, a first metal layer, a third insulation layer, and a second metal layer that are sequentially stacked in a direction away from the first gate layer; wherein
the at least one detection signal line is disposed in the first gate layer and is electrically connected to the second electrode of the at least one phototransistor through at least one first via hole in the first insulation layer;
the at least one input signal line is disposed in the first metal layer and is electrically connected to the first electrode of the at least one phototransistor through at least one second via hole in the first insulation layer and the second insulation layer; and
the at least one control signal line is disposed in the second metal layer and is electrically connected to the gate of the at least one phototransistor through at least one third via hole in the first insulation layer, the second insulation layer, and the third insulation layer.

12. The display device according to claim 10, wherein the display device further comprises a gate driver on array (GOA) circuit integrated in the flexible display panel; wherein
the GOA circuit is closer to the slidable region than the plurality of detection circuits are, or the GOA circuit is farther away from the slidable region than the plurality of detection circuits are.

13. The display device according to claim 2, wherein the display device further comprises a touch panel disposed on a display side of the flexible display panel; wherein the touch panel comprises a second substrate, and a second active layer, a fourth insulation layer, and a second gate layer that are sequentially stacked in a direction away from the second substrate; wherein
the second active layer comprises an active pattern of the at least one phototransistor, the active pattern comprises a channel region, the first electrode of the at least one phototransistor, and the second electrode of the at least one phototransistor, and an orthographic projection of the gate of the at least one phototransistor on the second substrate is within the channel region.

14. The display device according to claim 13, wherein the touch panel further comprises a fifth insulation layer, a third metal layer, a sixth insulation layer, and a fourth metal layer that are sequentially stacked in a direction away from the second gate layer; wherein
the at least one detection signal line is disposed in the second gate layer and is electrically connected to the second electrode of the at least one phototransistor through at least one first via hole in the fourth insulation layer;
the at least one input signal line is disposed in the third metal layer and is electrically connected to the first electrode of the at least one phototransistor through at least one second via hole in the fourth insulation layer and the fifth insulation layer; and
the at least one control signal line is disposed in the fourth metal layer and is electrically connected to the gate of the at least one phototransistor through at least one third via hole in the fourth insulation layer, the fifth insulation layer, and the sixth insulation layer.

15. The display device according to claim 13, wherein the display device further comprises a gate driver on array (GOA) circuit integrated in the flexible display panel; wherein
orthographic projections of the plurality of detection circuits on the flexible display panel are within a region in which the GOA circuit is disposed.

16. The display device according to claim 1, wherein the plurality of detection circuits comprise a plurality of first detection circuits and a plurality of second detection circuits; the at least one input signal line comprises a first input signal line and a second input signal line; the at least one control signal line comprises a first control signal line and a second control signal line; and the at least one detection signal line comprises a first detection signal line and a second detection signal line; wherein
the plurality of first detection circuits, the first input signal line, the first control signal line, and the first detection signal line are all disposed in the peripheral region and close to a first boundary of the slidable region, and the plurality of first detection circuits are electrically connected to the first input signal line, the first control signal line, and the first detection signal line; and
the plurality of second detection circuits, the second input signal line, the second control signal line, and the second detection signal line are all disposed in the peripheral region and close to a second boundary of the slidable region, the plurality of second detection circuits are electrically connected to the second input signal line, the second control signal line, and the second detection signal line, wherein an extension direction of the first boundary and an extension direction of the second boundary are both the first direction.

17. The display device according to claim 16, wherein
the plurality of first detection circuits and the plurality of second detection circuits are symmetrically arranged about an axis of the slidable region, an extension direction of the axis being parallel to the first direction; and the first input signal line and the second input signal line are symmetrically arranged about the axis;

the first control signal line and the second control signal line are symmetrically arranged about the axis; and the first detection signal line and the second detection signal line are symmetrically arranged about the axis.

18. The display device according to claim 16, wherein the display device further comprises an input signal connection line, a control signal connection line, and a detection signal connection line; wherein the first input signal line and the second input signal line are connected through the input signal connection line, the first control signal line and the second control signal line are connected through the control signal connection line, and the first detection signal line and the second detection signal line are connected through the detection signal connection line;

wherein the input signal connection line, the control signal connection line, and the detection signal connection line are all disposed in the peripheral region that is on a side of the slidable region away from the fixed region.

19. A method for controlling a display device, wherein the display device comprises:

a flexible display panel comprising a display region and a peripheral region surrounding the display region, wherein the display region comprises a slidable region and a fixed region;

a driver integrated circuit (IC) disposed in the peripheral region;

a plurality of detection circuits disposed in the peripheral region and close to the slidable region;

at least one input signal line, wherein one end of the at least one input signal line is electrically connected to the driver IC and the other end of the at least one input signal line is electrically connected to the plurality of detection circuits;

at least one control signal line, wherein one end of the at least one control signal line is electrically connected to the driver IC and the other end of the at least one control signal line is electrically connected to the plurality of detection circuits; and at least one detection signal line, wherein one end of the at least one detection signal line is electrically connected to the driver IC and the other end of the at least one detection signal line is electrically connected to the plurality of detection circuits;

wherein each of the plurality of detection circuits is turned off under control of a control signal provided by the at least one control signal line, and is configured to transmit a detection current to the at least one detection signal line based on an input signal provided by the at least one input signal line when detecting external ambient light; the driver IC stores a corresponding relationship between a current range and a length of an effective display region in a first direction, wherein the effective display region comprises the fixed region and an expanded region of the slidable region, and the first direction is an arrangement direction of the slidable region and the fixed region; the driver IC is configured to determine the length of the effective display region of the flexible display panel in the first direction based on a magnitude of the detection current in the at least one detection signal line and the corresponding relationship and control the effective display region to display an image based on the length of the effective display region; and the method comprising:

in a process of rolling up or unrolling the slidable region of the flexible display panel, turning on at least one target detection circuit in the plurality of detection circuits when the at least one target detection circuit detects the external ambient light, and transmitting, by the at least one target detection circuit, the detection current to the at least one detection signal line based on the input signal provided by the at least one input signal line; wherein the at least one target detection circuit is disposed in the peripheral region of the flexible display panel that is proximate to the slidable region in the effective display region;

determining, by the driver integrated circuit (IC), the length of the effective display region of the flexible display panel in the first direction based on the corresponding relationship between the current range and the length of the effective display region in the first direction, and the magnitude of the detection current in the at least one detection signal line; and controlling, by the driver IC, the effective display region to display the image based on the length of the effective display region of the flexible display panel in the first direction.

20. The method according to claim 19, wherein the magnitude of the detection current in the at least one detection signal line is positively correlated with a number of target detection circuits in the plurality of detection circuits; and the length of the effective display region in the first direction is positively correlated with the magnitude of the detection current in the at least one detection signal line.

* * * * *